(12) United States Patent
Matsuda et al.

(10) Patent No.: US 10,690,732 B2
(45) Date of Patent: Jun. 23, 2020

(54) MAGNETIC FIELD MEASURING METHOD AND MAGNETIC FIELD MEASURING APPARATUS

(71) Applicant: Mitsubishi Electric Corporation, Chiyoda-ku (JP)

(72) Inventors: Tetsuya Matsuda, Chiyoda-ku (JP); Kazuo Yamamoto, Chiyoda-ku (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 0 days.

(21) Appl. No.: 15/766,238

(22) PCT Filed: Aug. 22, 2016

(86) PCT No.: PCT/JP2016/074333
§ 371 (c)(1),
(2) Date: Apr. 5, 2018

(87) PCT Pub. No.: WO2017/098753
PCT Pub. Date: Jun. 15, 2017

(65) Prior Publication Data
US 2018/0284198 A1    Oct. 4, 2018

(30) Foreign Application Priority Data
Dec. 8, 2015 (JP) ................. 2015-239029

(51) Int. Cl.
*G01R 33/02* (2006.01)
*H01F 7/20* (2006.01)
(Continued)

(52) U.S. Cl.
CPC ........ *G01R 33/0206* (2013.01); *G01B 7/003* (2013.01); *G01B 7/305* (2013.01);
(Continued)

(58) Field of Classification Search
CPC .................................. G01R 33/0206
See application file for complete search history.

(56) References Cited

FOREIGN PATENT DOCUMENTS

| JP | 62-100671 A | 5/1987 |
|----|-------------|--------|
| JP | 7-244143 A  | 9/1995 |

(Continued)

OTHER PUBLICATIONS

International Search Report dated Nov. 8, 2016, in PCT/JP2016/074333 filed Aug. 22, 2016.

(Continued)

*Primary Examiner* — Noam Reisner
(74) *Attorney, Agent, or Firm* — Oblon, McClelland, Maier & Neustadt, L.L.P.

(57) ABSTRACT

A magnetic field measuring method includes: a first radial-magnetic-field measuring using a magnetic field measuring element placed at an offset position apart from the coil axis, to thereby measure, at the offset position, first radial magnetic fields along an offset axis parallel to the coil axis; a second radial-magnetic-field measuring using the magnetic field measuring element after being rotated by a set angle, to thereby measure, at the offset position, second radial magnetic fields along the offset axis; and a center-position determining the inter-coil center position, based on a first radial-magnetic-field characteristic that is a characteristic in a direction of the offset axis of the first radial magnetic fields, and a second radial-magnetic-field characteristic that is a characteristic in the direction of the offset axis of the second radial magnetic fields.

8 Claims, 25 Drawing Sheets

(51) Int. Cl.
*G01B 7/00* (2006.01)
*G01B 7/305* (2006.01)
*G01R 33/07* (2006.01)
*H05H 7/04* (2006.01)

(52) U.S. Cl.
CPC ............ *G01R 33/02* (2013.01); *G01R 33/07* (2013.01); *H01F 7/20* (2013.01); *H05H 7/04* (2013.01)

(56) References Cited

FOREIGN PATENT DOCUMENTS

JP          2001-4725 A     1/2001
JP          2001004725 A   *   1/2001   ............... G01R 3/02

OTHER PUBLICATIONS

Extended European Search Report dated Aug. 1, 2019, in Patent Application No. 16872653.7, 12 pages.

* cited by examiner

MAGNETIC FIELD MEASURING METHOD AND MAGNETIC FIELD MEASURING APPARATUS

TECHNICAL FIELD

The present invention relates to a magnetic field measuring method for correcting mainly a displacement of an accelerator coil.

BACKGROUND ART

With respect to an accelerator coil incorporated in an electromagnet of an accelerator, in order to accelerate charged particles up to an intended kinetic energy, it is required that an axis and an up-down center plane of the accelerator coil coincide highly accurately with a reference axis and a reference plane to be described later, respectively. For example, in an accelerator such as a synchrocyclotron or the like, a split solenoid coil in which two coils are paired is incorporated. For the split solenoid coil, it is required to reduce, as much as possible, positional errors of three types according to: an inclination of the coil axis from the reference axis; a horizontal displacement of the coil axis from the reference axis; and a displacement of an up-down center position between the two coils from the reference plane. In many cases, the reference axis and the reference plane are set on a highly accurately-fabricated iron yoke of a cryostat or electromagnet, to be described later.

In Patent Document 1, there is described a magnetic field measuring apparatus and method for causing a structure center of a solenoid electromagnet used for convergence, etc. of charged particles in an accelerator, to be matched to the magnetic center line of the solenoid electromagnet. According to the magnetic field measuring apparatus of Patent Document 1, as shown, for example, in FIG. 1 of Patent Document 1, vertically and horizontally-directed two magnetic-field sensors (magnetic field measuring elements) are placed on a rotatable disk, so that an inclination of a coil axis of a solenoid coil, etc. and a horizontal displacement of the coil axis, relative to a reference axis, are corrected based on a magnetic field characteristic measured by the magnetic field sensors while the disk is being rotated.

Meanwhile, in Patent Document 2, there is described a magnetic field measuring method of measuring a three-dimensional magnetic field distribution of a magnetic instrument such as a deflection yoke apparatus, a transformer or the like. According to a magnetic field measuring apparatus shown in FIG. 12 of Patent Document 2, a magnetic field sensor (magnetic field measuring element) that comprises a Hall element and is placed at an angle of $\pi/4$ or $3\pi/4$ on an axis (sensor rotation axis) parallel to the coil axis, is rotated around that sensor rotation axis, to thereby measure three magnetic field components Bx, By, Bz.

CITATION LIST

Patent Document

Patent Document 1: Japanese Patent Application Laid-open No. 2001-4725 (Paragraphs 0009 to 0014; Paragraph 0018; FIG. 1; FIG. 10)
Patent Document 2: Japanese Patent Application Laid-open No. S62-100671 (Line 14, Right-upper Column, Page 3 to Line 3, Left-lower Column, Page 3; Line 1, Left-lower Column, Page 7 to Line 3, Right-upper Column, Page 8; FIG. 12)

SUMMARY OF THE INVENTION

Problems to be Solved by the Invention

The split solenoid coil is a coil pair in which two coils of the same shape are placed to commonly have a coil axis and to be up-down symmetric (front-rear symmetric) to each other on the coil axis. For such a coil pair, as described above, it is required to reduce, as much as possible, the positional errors of three types according to displacements relative to a reference axis and a reference plane having been set, namely, the inclination of the coil axis from the reference axis, the horizontal displacement of the coil axis from the reference axis, and the displacement of an inter-coil center plane including the inter-coil center position from the reference plane. Further, with respect also to a combination coil provided with a plurality of coils having a common coil axis, its radial-magnetic-field distribution along the coil axis may be made symmetric about a plane perpendicular to the coil axis. In such a coil, a position about which the radial-magnetic-field distribution is up-down symmetric (front-rear symmetric) on an axis parallel to the coil axis, is the inter-coil center position. For such a combination coil, it is also required to reduce, as much as possible, the positional errors according to the displacements relative to the reference axis and the reference plane having been set.

However, in both Patent Document 1 and Patent Document 2, there is no description about a method of correcting the displacement of the inter-coil center plane, namely, about a method of causing the inter-coil center plane of the coil pair having two coils or the combination coil provided with a plurality of coils, to be accurately matched to the reference plane. Thus, a problem remains on how to measure the inter-coil center position.

An object of this invention is to provide a magnetic field measuring method for highly accurately determining the inter-coil center position of a combination coil provided with a plurality of coils.

Means for Solving the Problems

A magnetic field measuring method of the invention is a magnetic field measuring method in which, with respect to a measuring target coil which is a combination coil provided with a plurality of coils having a common coil axis and whose distribution along the coil axis of radial magnetic fields with respect to at least one radial direction, is symmetric about a plane perpendicular to the coil axis, an inter-coil center position is determined that is a center position in a direction of the coil axis in the distribution of the radial magnetic fields, said magnetic field measuring method characterized by comprising: a first radial-magnetic-field measuring step of using a magnetic field measuring element placed at an offset position radially apart by a set length from the coil axis, to thereby measure, at the offset position, first radial magnetic fields along an offset axis that is parallel to the coil axis; a second radial-magnetic-field measuring step of using the magnetic field measuring element after being rotated by a set angle around the offset axis, to thereby measure, at the offset position, second radial magnetic fields along the offset axis; and a center-position determining step of determining the inter-coil center position on the basis of: a first radial-magnetic-field characteristic that is a characteristic in a direction of the offset axis of the first radial magnetic fields measured in the first radial-magnetic-field measuring step; and a second radial-magnetic-field characteristic that is a characteristic in the direction of the offset axis of the second radial magnetic fields measured in the second radial-magnetic-field measuring step.

Effect of the Invention

According to the magnetic field measuring method of the invention, the inter-coil center position is determined on the basis of the radial-magnetic-field characteristics before and after rotation at the offset position around the offset axis that is parallel to the coil axis, so that it is possible to highly accurately determine the inter-coil center position of the combination coil as a measuring target provided with a plurality of coils.

MODES FOR CARRYING OUT THE INVENTION

Embodiment 1

Figure 1:
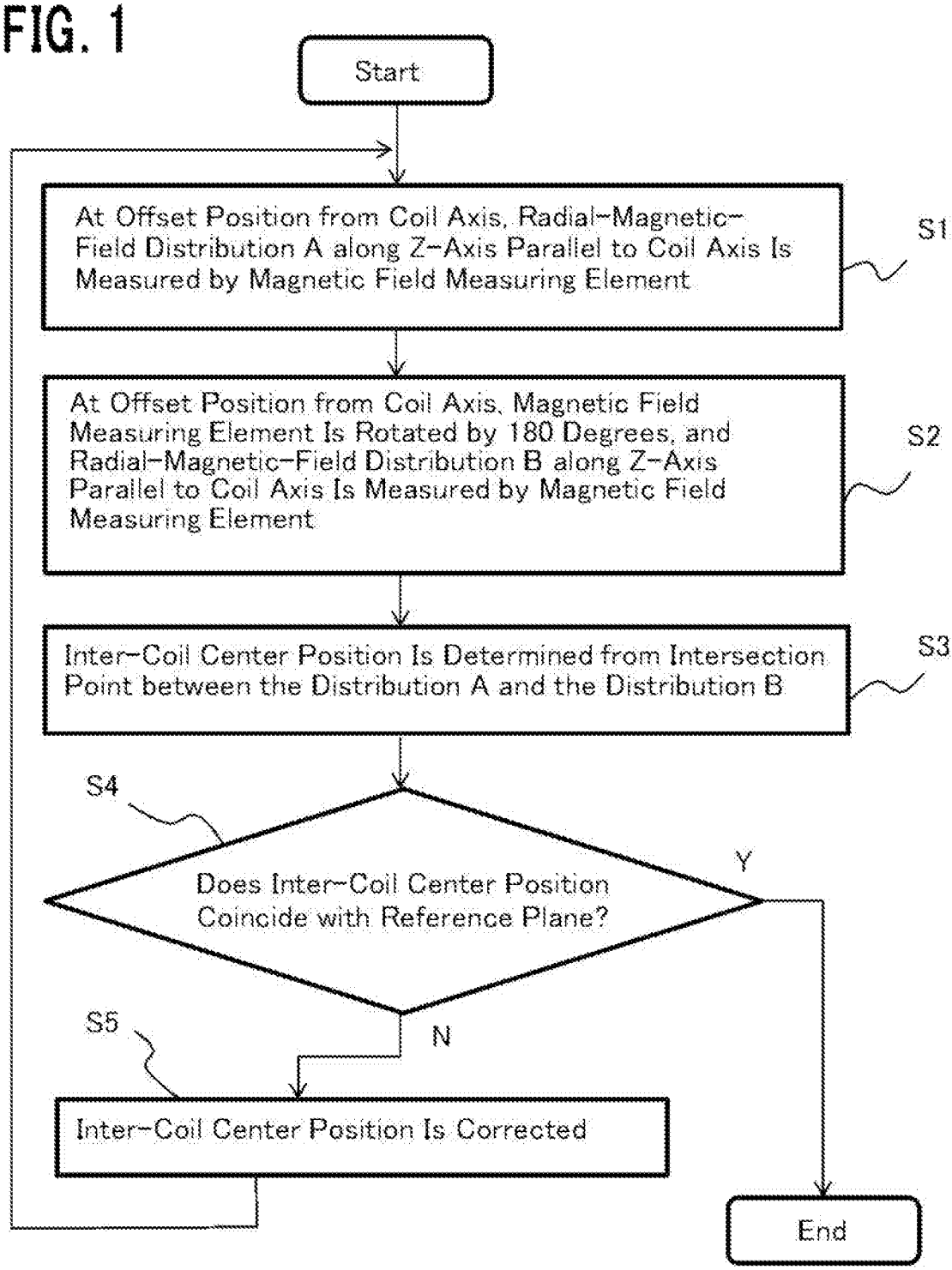
FIG. 1 is a flowchart of a coil displacement correction method that includes a magnetic field measuring method according to Embodiment 1 of the invention.
Figure 2:
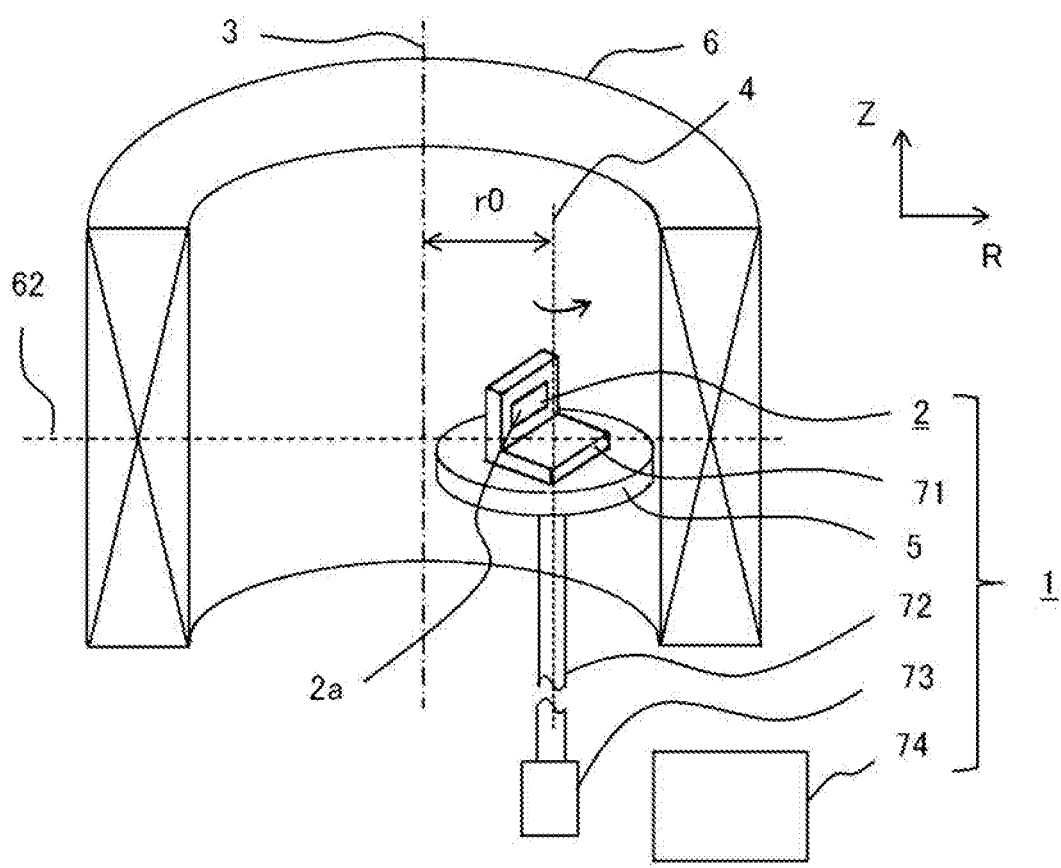
FIG. 2 is a diagram showing a magnetic field measuring apparatus according to Embodiment 1 of the invention.
Figure 3:
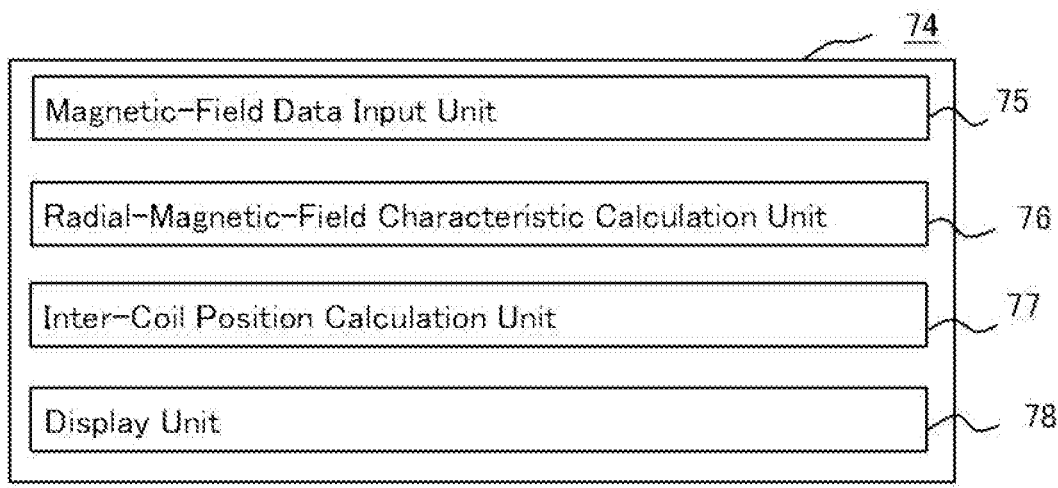
FIG. 3 is a diagram showing a data processing device in FIG. 2.
Figure 4:
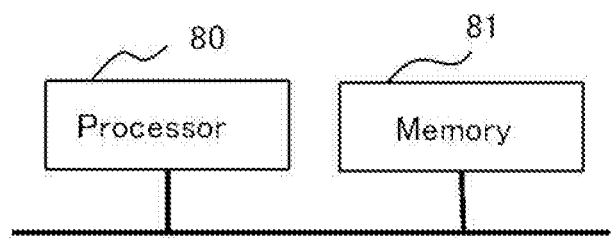
FIG. 4 is a diagram showing a hardware configuration by which functional blocks in the data processing device are implemented.
Figure 5:
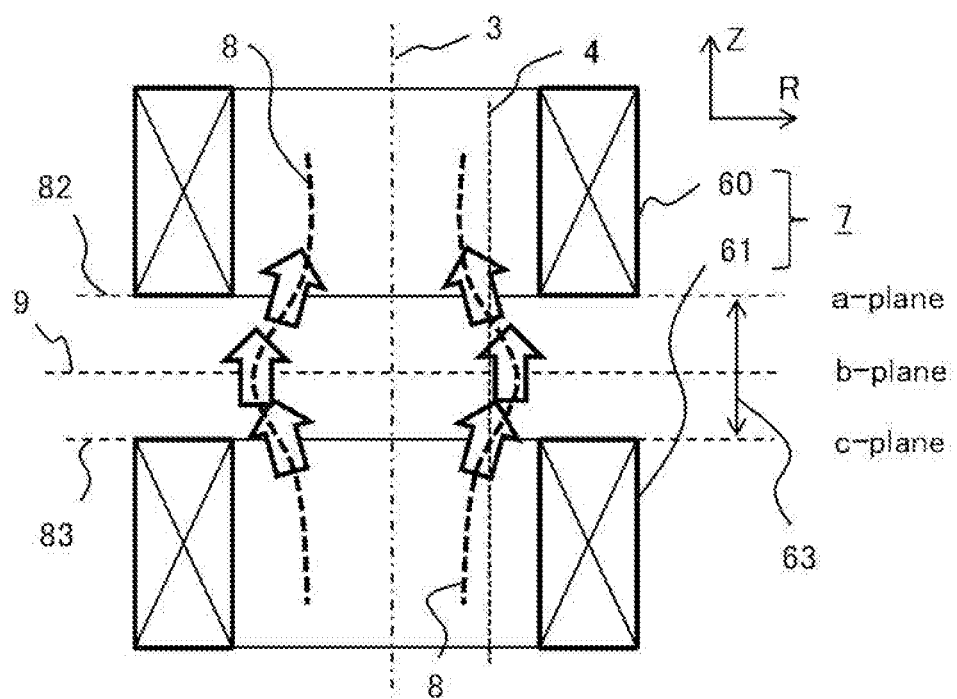
FIG. 5 is a diagram showing magnetic flux lines of a split solenoid coil as a measuring target of the invention.
Figure 6:
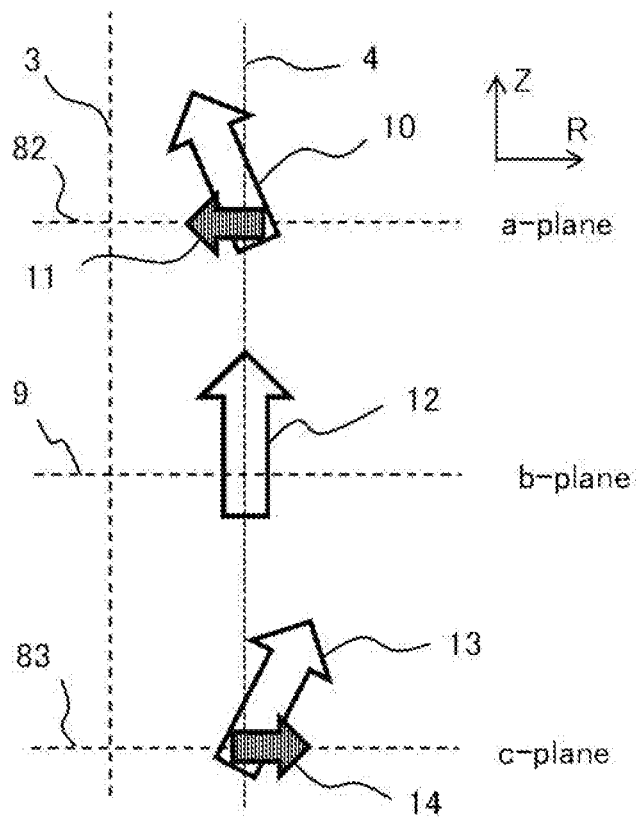
FIG. 6 is a diagram for illustrating magnetic flux vectors of the magnetic flux lines in FIG. 5.
Figure 7:
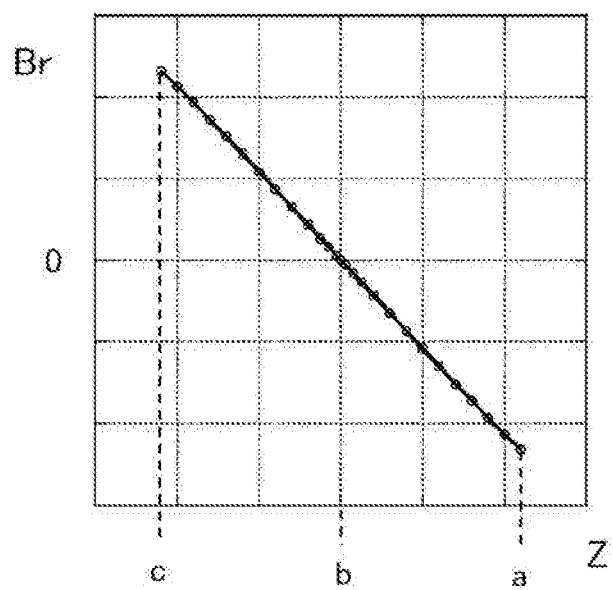
FIG. 7 is a diagram showing a Z-direction distribution of radial magnetic-field components of the split solenoid coil in FIG. 5.
Figure 8:
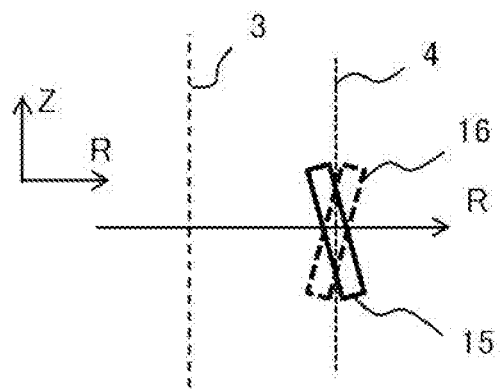
FIG. 8 is a diagram showing states of a magnetic field measuring element in FIG. 2 before and after being rotated.
Figure 9:
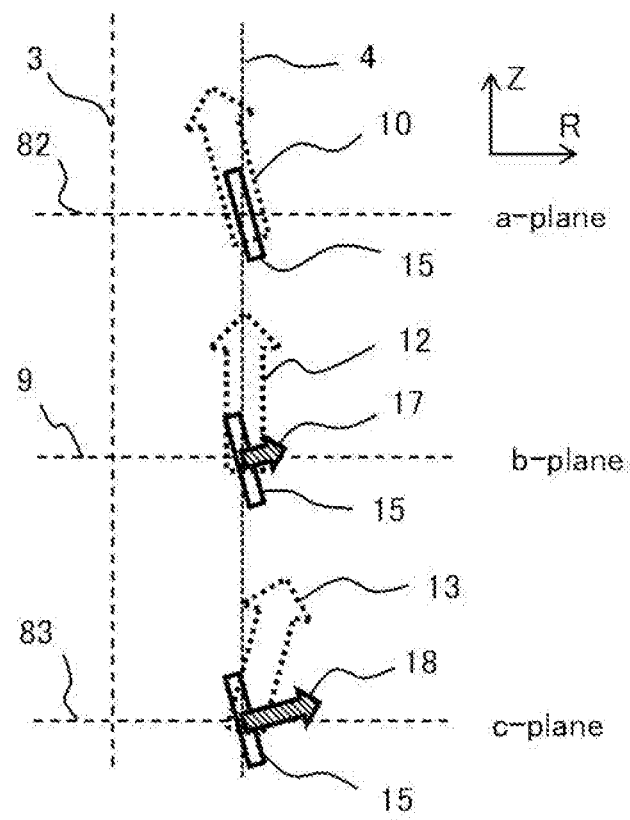
FIG. 9 is a diagram showing magnetic field components in a surface-perpendicular direction of the magnetic field measuring element before being rotated.
Figure 10:
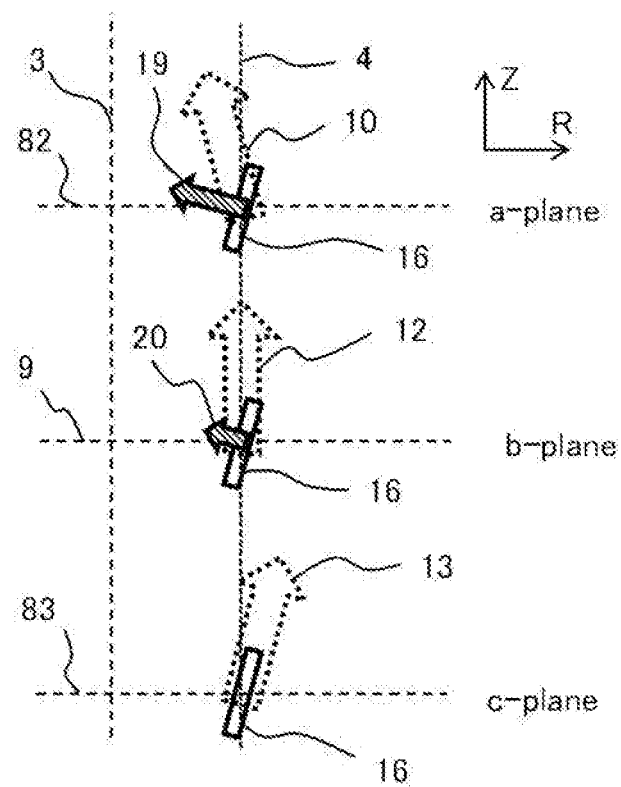
FIG. 10 is a diagram showing magnetic field components in the surface-perpendicular direction of the magnetic field measuring element after being rotated.

FIG. 1 is a flowchart of a coil displacement correction method that includes a magnetic field measuring method according to Embodiment 1 of the invention. FIG. 2 is a diagram showing a magnetic field measuring apparatus according to Embodiment 1 of the invention, and FIG. 3 is a diagram showing a data processing device in FIG. 2. FIG. 4 is a diagram showing a hardware configuration by which functional blocks in the data processing device are implemented. FIG. 5 is a diagram showing magnetic flux lines of a split solenoid coil as a measuring target of the invention, and FIG. 6 is a diagram for illustrating magnetic flux vectors of the magnetic flux lines in FIG. 5. FIG. 7 is a diagram showing a Z-direction distribution of radial magnetic-field components of the split solenoid coil in FIG. 5. FIG. 8 is a diagram showing states of a magnetic field measuring element in FIG. 2 before and after being rotated. FIG. 9 is a diagram showing magnetic field components in a surface-perpendicular direction of the magnetic field measuring element before being rotated, and FIG. 10 is a diagram showing magnetic field components in the surface-perpendicular direction of the magnetic field measuring element after being rotated. FIG. 1/1 is a diagram showing Z-direction distributions of radial magnetic-field components measured by the magnetic field measuring element in FIG. 2.

Using FIG. 1 and FIG. 2, a coil displacement correction method that includes the magnetic field measuring method according to Embodiment 1 of the invention will be described. A coil 6 in FIG. 2 is a target for which the magnetic field measuring method according to Embodiment 1 is executed. A magnetic field measuring apparatus 1 in FIG. 2 executes the magnetic field measuring method and the displacement correction method about the coil 6 that is the target for which measurement and displacement correction are to be performed. The magnetic field measuring apparatus 1 in FIG. 2 is an example for performing the magnetic field measuring method and the displacement correction method of the invention.

The coil 6 in FIG. 2 is a solenoid coil. The magnetic field measuring apparatus 1 includes: a magnetic field measuring element 2; a magnetic-field-measuring-element supporting table 71 for supporting the magnetic field measuring element 2; a rotary table 5 on which the magnetic-field-measuring-element supporting table 71 is mounted; a rotatable rod 72 fixed to the rotary table 5; a motor 73 for rotating the rotatable rod 72; and a data processing device 74 for calculating an inter-coil center position from magnetic-field data inputted from the magnetic measuring element 2. The magnetic field measuring element 2 is placed so as to rotate around a rotation axis 4 in association with the rotation of the rotary table 5. The rotation axis 4 is also a rotation axis of the rotatable rod 72. The magnetic field measuring element 2 is placed so that the rotation axis 4 is at a position (offset position) radially displaced from a coil axis 3 that is the center axis of the coil 6.

In FIG. 2, the length from the coil axis 3 to the rotation axis 4, namely, the offset length, is r0. The coil axis 3 is an example of a reference axis given as a reference for the offset length. In FIG. 2, the extending direction of the coil axis 3 is a Z-direction, and the extending direction of a radial axis 62 perpendicular to the coil axis 3 is a radial direction (R-direction). As described previously, the inter-coil center position is a position of an inter-coil center plane in a coil pair in which two coils of the same shape are placed to commonly have a coil axis and to be up-down symmetric (front-rear symmetric) to each other on the coil axis. A split solenoid coil 7 shown in FIG. 5 includes a first coil 60 and a second coil 61 of the same shape, in which the first coil 60 and the second coil 61 are placed to commonly have the coil axis 3 and to be up-down symmetric (front-rear symmetric) on the coil axis. In the split solenoid coil 7 in FIG. 5, the inter-coil center position is a position of the inter-coil center plane 9 placed intermediately between a first-coil plane 82 of the first coil 60 and a second-coil plane 83 of the second coil 61. The first-coil plane 82 and the second-coil plane 83 are planes opposite to each other. As shown in FIG. 5, when the first coil 60 and the second coil 61 are placed so that the coil axis 3 is in a perpendicular direction (vertical direction), the first coil 60 is at the upper side and the second coil 61 is at the lower side. In FIG. 5, the first coil 60 and the second coil 61 are placed to be up-down symmetric on the coil axis. "Up-down symmetric on the coil axis" is a term with the assumption that they are placed so that the coil axis is in the perpendicular direction (vertical direction). "Up" and "down" in the explanation of this DESCRIPTION express "up" and "down" in the paper plane on which the diagram is drawn. Also, when "horizontal" or "perpendicular" is expressed without indication of any comparison criterion, this expresses "horizontal" or "perpendicular" in the paper plane on which the diagram is drawn. Accordingly, when the coil axis is set in the horizontal direction (lateral direction), "up-down symmetric" is indicated instead as "front-rear symmetric" or "right-left symmetric".

The split solenoid coil 7 shown in FIG. 5 includes the first coil 60 and the second coil 61 of the same shape, and the first coil 60 and the second coil 61 are placed to commonly have the coil axis 3 and to be up-down symmetric (front-rear symmetric) to each other on the coil axis, so that, as will be described later, the distribution of radial magnetic fields Br along the coil axis 3 is symmetric about a plane (inter-coil center plane 9) perpendicular to the coil axis 3. Since the split solenoid coil 7 shown in FIG. 5 is placed to be up-down symmetric (front-rear symmetric) on the coil axis, it may be said to include two coils (first coil 60, second coil 61) whose distribution of radial magnetic fields Br along the coil axis 3 is up-down symmetric (front-rear symmetric) about the plane (inter-coil center plane 9) perpendicular to the coil axis 3.

The magnetic field measuring element 2 detects a magnetic field perpendicular to a magnetic field measuring surface 2a that is a surface for receiving the magnetic field. The magnetic field measuring element 2 is, for example, a Hall element. When the magnetic field measuring element 2 is a Hall element, the magnetic field measuring surface 2a is a surface where the Hall element receives the magnetic field. The magnetic field measuring surface 2a of the Hall element is hereinafter referred to as a Hall element surface. Note that, with respect to the magnetic field measuring element 2, a Hall element is shown as an example; however, it is not limited to a Hall element, and may be a magnetic field measuring element with other directionality, such as an MI (Magneto Impedance) element, or the like.

In Step S1, at the offset position from the coil axis 3 of the measuring target (the position of the rotation axis 4), a radial-magnetic-field distribution A along the Z-axis (rotation axis 4) that is parallel to the coil axis 3 is measured by the magnetic field measuring element 2 (first radial-magnetic-field measuring step). In Step S2, at the offset position from the coil axis 3 (the position of the rotation axis 4), the magnetic field measuring element 2 is rotated by 180 degrees and then a radial-magnetic-field distribution B along the Z-axis (rotation axis 4) that is parallel to the coil axis 3 is measured by the magnetic field measuring element 2 (second radial-magnetic-field measuring step). In Step S3, the inter-coil center position is determined from an intersection point between the radial-magnetic-field distribution A and the radial-magnetic-field distribution B (center-position determining step). In Step S4, whether the inter-coil center position coincides with a reference plane is determined, and if it coincides, processing is terminated. In Step S4, if the inter-coil center position is determined not to coincide with the reference plane, the flow moves to Step S5. In Step S5, a structural object of the measuring target is moved so that the inter-coil center position is corrected so as to coincide with the reference plane. Thereafter, the flow returns to Step S1 and Step S1 to Step S4 are repeated until the inter-coil center position is determined to coincide with the reference plane in Step 4. The principle of how to determine the inter-coil center position in Step S3 will be described later.

The data processing device 74 includes a magnetic-field data input unit 75, a radial-magnetic-field characteristic calculation unit 76, an inter-coil position calculation unit 77 and a display unit 78. The magnetic-field data input unit 75 receives the magnetic field data transmitted from the magnetic field measuring element 2. The radial-magnetic-field characteristic calculation unit 76 executes Step S1 and Step S2 on the basis of the magnetic field data of the magnetic field measuring element 2 inputted from the magnetic-field data input unit 75. Namely, the radial-magnetic-field characteristic calculation unit 76 calculates the radial-magnetic-field distribution A in Step S1 and the radial-magnetic-field distribution B in Step S2, on the basis of the magnetic field data of the magnetic field measuring element 2 inputted from the magnetic-field data input unit 75. The inter-coil position calculation unit 77 executes Step S3. Namely, the inter-coil position calculation unit 77 calculates to determine the inter-coil center position from the intersection point between the radial-magnetic-field distribution A and the radial-magnetic-field distribution B calculated by the radial-magnetic-field characteristic calculation unit 76. The display unit 78 applies image processing to the data of the radial-magnetic-field distribution A, the radial-magnetic-field distribution B and the inter-coil center position that is the intersection point between them, to thereby display the radial-magnetic-field distribution A, the radial-magnetic-field distribution B and the inter-coil center position on a display screen of the display unit 78. At the display unit 78, the position of the reference plane having been set is also displayed. The operator confirms the inter-coil center position and the position of the reference plane displayed on the display screen of the display unit 78, and then executes processing in Step S5. Namely, the operator confirms the inter-coil center position and the position of the reference plane displayed at the display unit 78, and then corrects the inter-coil center position by moving the structural object of the measuring target.

The radial-magnetic-field characteristic calculation unit 76, the inter-coil position calculation unit 77 and the display unit 78 are implemented in such a manner that a processor 80 executes programs stored in a memory 81. Instead, plural processors 80 and plural memories 81 may execute the above functions in their cooperative manner.

Here, the reference plane is a given horizontal plane in the measuring target, which is a plane to which the inter-coil center position is to be matched. Prior to subsequently describing operations in detail, description will be made about the reference plane, the reference axis and coil positional errors.

For example, when such a magnet in which a core (also referred to as a magnetic pole) that could be highly-accurately fabricated is incorporated, is provided as the measuring target, the reference plane is set with respect to the magnetic pole (for example, at an inter-pole center position in the pole gap, or the like). Using the magnetic field measuring apparatus 1, the coil position is adjusted relative to the reference plane of the magnetic pole so that a coil up-down center (inter-coil center position) coincides with the reference plane. When the measuring target coil is an air-core superconductive coil, using the magnetic field measuring apparatus 1, the coil position is adjusted so that a coil up-down center coincides with a reference plane provided as an up-down center position of the cryostat. Note that the cryostat has a function to store the superconductive coil and to keep the superconductive coil at an ultra-low temperature.

The reference axis is established in a manner similar to how the reference plane is set, and thus, when the measuring target is an electromagnet equipped with a highly-accurately fabricated iron yoke, an axis of a hole created around the center of the iron yoke is provided as the reference axis, for example. When the measuring target is a superconductive coil, a center axis of the highly-accurately-fabricated ambient-temperature bore of a cryostat is set as the reference axis. Here, as described previously, description will be made using an example in which the reference axis given as a reference for the offset length is the coil axis 3 whose displacement has been adjusted.

The coil positional errors are required to be adjusted relative to these reference plane and reference axis. In particular for a coil such as of an accelerator electromagnet, whose position is needed to be highly-accurately adjusted, it is required to adjust the coil positional errors. With respect to the reference axis and the reference plane, the coil positional errors comprise three types of errors according to the followings, so that the coil position is required to be adjusted relative to these reference axis and reference plane.

(1) A horizontal displacement of the coil axis 3 relative to the reference axis (first-type coil displacement)

(2) An inclination of the coil axis 3 relative to the reference axis (second-type coil displacement)

(3) A displacement of the inter-coil center position relative to the reference plane (third-type coil displacement)

With respect to the first to three-type coil displacements, measuring and correcting processes on the first-type coil displacement and the second-type coil displacement are described in Patent Document 1 explained in BACKGROUND ART. In the coil displacement correction method of Embodiment 1, it is assumed that the first-type coil displacement and the second-type coil displacement have already been corrected by the application of the measuring and correcting processes and the like in Patent Document 1.

In the following, the principle of how to measure the third-type coil displacement will be described. When the first-type coil displacement and the second-type coil displacement have been corrected, a coil magnetic-field distribution is as shown in FIG. 5. The split solenoid coil 7 as the measuring target includes the first coil 60 and the second coil 61. In FIG. 5, magnetic flux lines 8 of the split solenoid coil 7 are shown. Shown here are only two magnetic flux lines 8. In FIG. 5, the first-coil plane 82 of the first coil 60, the second-coil plane 83 of the second coil 61 and the inter-coil center plane 9 placed intermediately between the first-coil plane 82 and the second-coil plane 83, are shown. In FIG. 5, the magnetic flux line 8 on the right side is a magnetic flux line near the rotation axis 4. Note that, where appropriate, the first-coil plane 82, the inter-coil center plane 9 and the second-coil plane 83 are referred to as an a-plane, a b-plane and a c-plane, respectively.

An example in FIG. 5 corresponds to an illustration of an ideal case where the inter-coil center plane 9 including the inter-coil center position coincides with the reference plane, namely, the inter-coil center position is positioned on the reference plane. Note that the situation where the inter-coil center position is positioned on the reference plane can also be said that the inter-coil center position coincides with the reference plane. As described above, the first-type coil displacement and the second-type coil displacement have been corrected, so that the first-coil plane 82, the second-coil plane 83 and the inter-coil center plane 9 are parallel to each other. In general, the inter-coil center position does not coincide with the reference plane, and thus the inter-coil center position is caused to coincide with the reference plane in such a manner that the inter-coil center position is detected using the magnetic field measuring apparatus 1 of Embodiment 1 and then the vertical positions (positions in Z-direction) of the first coil 60 and the second coil 61 are adjusted.

In FIG. 5, examples of magnetic field vectors (arrows) along the magnetic flux lines 8 of the split solenoid coil 7 split into the coils of the same shape along the extending direction of the coil axis 3, namely, the Z-direction, are shown at the positions of the three planes of the a-plane, the b-plane and the c-plane. Near the middle plane of the split solenoid coil 7, due to an air layer 63 between the first-coil plane 82 and the second-coil plane 83, the magnetic flux line 8 is going to escape out in the radial direction, and accordingly, this results in a distribution expanded in the radial direction (direction toward the outer circumference). In the case of the split solenoid coil, which is not a simple solenoid coil, the expansion of the magnetic field (magnetic flux line 8) near the middle plane becomes large as shown in FIG. 5.

FIG. 6 is a diagram in which only the magnetic flux vectors along the rotation axis 4 of the magnetic field measuring element 2 in FIG. 5 are extracted. The rotation axis 4 is an axis that is placed at the offset position apart by a given length from the coil axis 3 and is parallel to the Z-axis. At the a-plane in FIG. 6, the magnetic field vector of the split solenoid coil 7 is a magnetic field vector 10, with which a radial component 11 of the magnetic field vector 10 is also shown. Likewise, at the c-plane in FIG. 6, the magnetic field vector of the split solenoid coil 7 is a magnetic field vector 13, with which a radial component 14 of the magnetic field vector 13 is also shown. The radial component 11 and the radial component 14 are also horizontal components along the first-coil plane 82 and the second-coil plane 83 that are perpendicular to the coil axis 3, respectively. At the b-plane in FIG. 6, the magnetic field vector of the split solenoid coil 7 is a magnetic field vector 12, and the magnetic field vector 12 is parallel to the coil axis 3 and the rotation axis 4 and is directed in the Z-direction.

In the distribution of magnetic flux density along the rotation axis 4, an inwardly-tilted magnetic field is provided at the a-plane and a magnetic field perpendicular to the radial direction is provided at the b-plane. In the distribution of magnetic flux density along the rotation axis 4, an outwardly-tilted magnetic field is provided at the c-plane. Thus, horizontal (radial) magnetic-field components in opposite directions emerge at the a-plane and the c-plane.

The relationship between the radial magnetic field and a coil-axial direction (Z-direction) that is a direction parallel to the coil axis 3 is shown in FIG. 7. The characteristic shown in FIG. 7 is a characteristic actually and numerically calculated based on the Biot-Savart formula from a distribution with respect to a certain split solenoid coil. The ordinate represents the radial (horizontal) magnetic field Br. The abscissa represents a position in the extending direction (perpendicular direction) of the coil axis 3, namely, a position on the Z-axis (position in the Z-direction). As shown in the figure, it is found that the distribution of the radial magnetic fields Br deforms linearly along the Z-axis and the magnetic field is zero at the b-plane. When the position of the b-plane is determined as a center, at respective positions with the same distance therefrom in the positive direction and the negative direction, the radial magnetic fields Br are equal in magnitude. Namely, as described previously, the distribution of the radial magnetic fields Br along the coil axis 3 is symmetric about a plane perpendicular to the coil axis 3 (b-plane, inter-coil center plane 9). When the reference plane and the inter-coil center plane are displaced from each other, the zero-magnetic-field position is not at the b-plane.

An attempt has been made to detect the radial-magnetic-field distribution using the magnetic field measuring element 2 as a directional magnetic field measuring element (Hall element). The Hall element that is a directional magnetic field measuring element is a magnetic field detection element which utilizes a Hall effect and whose detection voltage changes according to the direction of the magnetic field to be detected. First, a case where the magnetic field measuring element 2 is rotated on an axis provided at a position apart from the coil axis 3 and along the Z-axis, is shown in FIG. 8. In FIG. 8, a magnetic field measuring element 15 is the magnetic field measuring element before being rotated and a magnetic field measuring element 16 is the magnetic field measuring element after being rotated by 180 degrees using the rotation axis 4 of the magnetic field measuring element as an axis for rotation.

In order to measure the radial magnetic fields Br having such a characteristic shown in FIG. 7, for the magnetic field measuring element 2, the extending direction of the magnetic field measuring surface (Hall element surface) 2a is wanted to be directed, as much as possible, in the perpendicular direction (Z-direction). When so directed, at the inter-coil center position, the magnetic field generated by the coil is directed in the Z-direction, so that the radial magnetic field Br becomes zero. Thus, when the extending direction of the magnetic field measuring element 2 is perfectly directed in the perpendicular direction (Z-direction) as described later, it is possible to detect the inter-coil center position by detecting a zero radial magnetic field, namely, by detecting a position at which the radial magnetic field Br becomes zero.

However, when the magnetic field measuring element 2 is a Hall element, since the Hall element surface has a size as small as several millimeters and has inevitably an angular error, the extending direction of the Hall element surface is actually not directed in the perpendicular direction, so that the surface is placed to have an angle relative to the perpendicular direction (Z-direction), as shown by the magnetic field measuring element 15 in FIG. 8. In addition, there is a possibility that the Hall element is itself inclined in its package.

In this state, as shown by the magnetic field measuring element 16 in FIG. 8, if the element is rotated by 180 degrees around the rotation axis 4, the positional relationship between the magnetic field measuring element 15 and the magnetic field measuring element 16 is provided as a mirror-image positional relationship using, as a symmetry plane, a plane in which the rotation axis 4 is included. Ideally, such a condition is set up in which even if the magnetic field measuring element 2, specifically, the magnetic field measuring element 15 in FIG. 8, is rotated by 180 degrees, the angle between the coil axis 3 (Z-axis) and the Hall element surface does not change. This is achievable when, for example, the rotatable rod 72 in FIG. 2 is elongated. When the rotatable rod 72 becomes longer, its distances from the magnetic field measuring surface (Hall element surface) of the magnetic field measuring element 2 and from the coil axis 3 (Z-axis) become longer, so that an angular displacement can be determined highly accurately and the angular displacement can be corrected highly accurately.

Respective magnetic fields received by the magnetic field measuring surfaces (Hall element surfaces) 2a of the magnetic field measuring elements 15, 16 in FIG. 8 are shown in FIG. 9 and FIG. 10. In FIG. 9, magnetic fields are shown that are received by the magnetic field measuring surface (Hall element surface) 2a of the magnetic field measuring element 15 before being rotated, at three positions resulting from moving that element up and down in the Z-direction along the rotation axis 4. Further, in FIG. 10, magnetic fields are shown that are received by the magnetic field measuring surface (Hall element surface) 2a of the magnetic field measuring element 16 in the case where the magnetic field measuring element (Hall element) is rotated by 180 degrees without change of its radial position, at three positions resulting from moving that element up and down in the Z-direction along the rotation axis 4. In FIG. 9, a magnetic field component 17 is a magnetic field component received at the b-plane (inter-coil center plane 9) by the magnetic field measuring surface (Hall element surface) 2a of the magnetic field measuring element 15 before being rotated, and a magnetic field component 18 is a magnetic field component received at the c-plane (second-coil plane 83) by the magnetic field measuring element 15 before being rotated. In FIG. 10, a magnetic field component 19 is a magnetic field component received at the a-plane (first-coil plane 82) by the magnetic field measuring surface (Hall element surface) 2a of the magnetic field measuring element 16 after being rotated by 180 degrees, and a magnetic field component 20 is a magnetic field component received at the b-plane (inter-coil center plane 9) by the magnetic field measuring surface (Hall element surface) 2a of the magnetic field measuring element 16 after being rotated by 180 degrees.

Magnetic field vectors 10, 12, 13 received at the a-plane, b-plane and c-plane by the magnetic field measuring element 15 in FIG. 9 are the same as the magnetic field vectors 10, 12, 13 in FIG. 6. The reason why the magnetic field component received at the a-plane by the magnetic field measuring surface (Hall element surface) 2a of the magnetic field measuring element 15 is zero, is that, with respect to the a-plane that is uppermost in FIG. 9, such a case where the inclination of the magnetic field measuring surface (Hall element surface) 2a is the same as the inclination of the coil magnetic field (inclination of the magnetic field vector 10) has been shown as an example here. In this case, the magnetic field measuring surface (Hall element surface) 2a and the magnetic field (magnetic field vector) are directed parallel to each other. Since the Hall element detects only a magnetic field perpendicular to the Hall element surface, the magnetic field detected at the a-plane by the Hall element is zero. When the magnetic field measuring element 15 is placed at the c-plane in such a manner that it is moved toward the negative side in the Z-direction without being rotated, the magnetic field component received by the magnetic field measuring surface (Hall element surface) 2a of the magnetic field measuring element 15 becomes maximum as shown on the lowermost side in FIG. 9. The radial magnetic field Br varies linearly as shown in FIG. 7, so that, at the b-plane whose position is the intermediate position between the a-plane and the c-plane, it has a value that is half of that of the magnetic fields received at the a-plane and the c-plane. Note that the magnitude of the magnetic field component 17 before rotation and the magnitude of the magnetic field component 20 after rotation are the same. Namely, the magnetic field component 17 before rotation and the magnetic field component 20 after rotation are different in their directions but are the same in their magnitudes.

In general, at the a-plane, the inclination of the magnetic field measuring surface of the magnetic field measuring element 15 and the inclination of the magnetic field do not coincide with each other; however, the fact remains that, when the magnetic field measuring element is moved up and down, namely, when it is moved in the Z-direction, the radial magnetic field Br received by the magnetic field measuring element increases linearly from the upper side to the lower side, namely, according to a position in the Z-direction.

Figure 17:
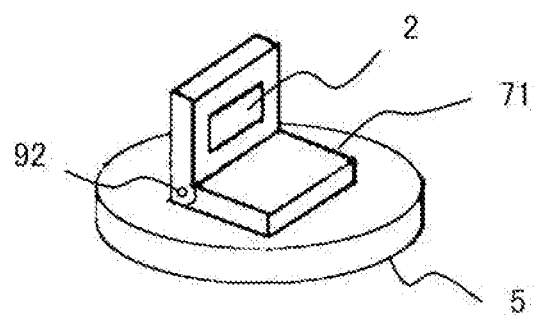
FIG. 17 is a diagram showing a magnetic-field-measuring-element supporting table that makes the inclination of the magnetic field measuring element changeable.
Figure 18:
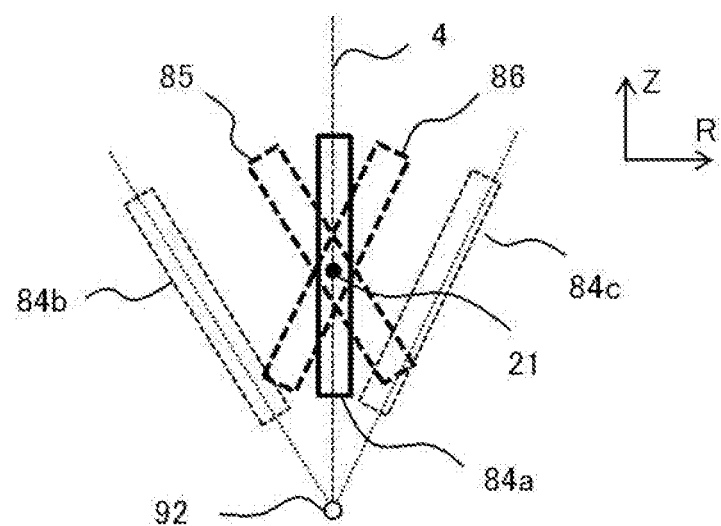
FIG. 18 is a diagram for illustrating correspondences between the magnetic field measuring element in FIG. 17 and the magnetic field measuring element in FIG. 12.

It is noted that when, as shown in FIG. 17, the magnetic-field-measuring-element supporting table 71 is provided with a rotatable rod 92, so that the magnetic field measuring element 2 can be rotated around the rotatable rod 92 as an axis (center), the inclination of the magnetic field measuring surface of the magnetic field measuring element can be adjusted. FIG. 17 is a diagram showing the magnetic-field-measuring-element supporting table that makes the inclination of the magnetic field measuring element changeable. FIG. 18 is a diagram for illustrating correspondences between the magnetic field measuring element in FIG. 17 and the magnetic field measuring element in FIG. 12. In FIG. 18, a magnetic field measuring element 84a corresponds to the magnetic field measuring element 84 in FIG. 12. In FIG. 18, a magnetic field measuring element 84c that is the magnetic field measuring element 84a after being rotated clockwise around the rotatable rod 92, and a magnetic field measuring element 84b that is the magnetic field measuring element 84a after being rotated counterclockwise around the rotatable rod 92, are shown. When the magnetic field measuring element 84b is parallelly shifted toward the rotation axis 4 so that the center of that element coincides with a rotation axis 21, a magnetic field measuring element 85 is provided. When the magnetic field measuring element 84c is parallelly shifted toward the rotation axis 4 so that the center of that element coincides with the rotation axis 21, a magnetic field measuring element 86 is provided.

Next, a magnetic field received by the magnetic field measuring element 16 that corresponds to the magnetic field measuring element 15 after being rotated by 180 degrees around the rotation axis 4, will be described using FIG. 10. In FIG. 8, the magnetic field measuring element 16 is shown by a broken line, whereas, in FIG. 10, the magnetic field measuring element 16 is shown by a solid line. Magnetic fields received by the magnetic field measuring element 16 in FIG. 10, namely, magnetic field vectors 10, 12, 13 received at the a-plane, b-plane and c-plane by the magnetic field measuring element 16, are the same as the magnetic field vectors 10, 12, 13 in FIG. 6. As shown in FIG. 10 and contrary to what shown in FIG. 9, the magnetic field component received by the magnetic field measuring surface (Hall element surface) 2a of the magnetic field measuring element 16 increases from the lower side to the upper side, namely, increases as the magnetic field measuring element 16 is moved toward the positive side in the Z-direction. Namely, at the c-plane in FIG. 10, the magnetic field component received by the magnetic field measuring surface (Hall element surface) 2a of the magnetic field measuring element 16 is zero, and at the a-plane in FIG. 10, the magnetic field component received by the magnetic field measuring surface (Hall element surface) 2a of the magnetic field measuring element 16 becomes maximum. At the b-plane in FIG. 10, the magnetic field component received by the magnetic field measuring surface (Hall element surface) 2a of the magnetic field measuring element 16 becomes a medium magnetic field component between the magnetic field component 19 at the a-plane and the magnetic field component at the c-plane. Note that the magnetic field component received at the c-plane in FIG. 10 by the magnetic field measuring surface (Hall element surface) 2a of the magnetic field measuring element 16 is zero and this is also because, in the case in FIG. 10, the inclination of the coil magnetic field (inclination of the magnetic field vector 13) and that of the magnetic field measuring surface (Hall element surface) are assumed to be the same at the c-plane, as an example here; however, said inclinations do not always coincide with each other.

Figure 11:
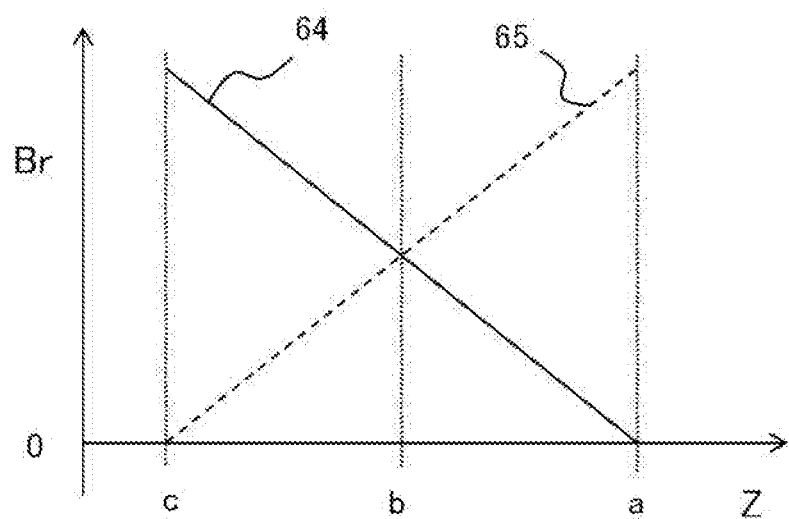
FIG. 11 is a diagram showing Z-direction distributions of radial magnetic-field components measured by the magnetic field measuring element in FIG. 2.

Further, the magnetic field component received at the b-plane in FIG. 9 by the magnetic field measuring surface (Hall element surface) 2a of the magnetic field measuring element 15 and the magnetic field component received at the b-plane in FIG. 10 by the magnetic field measuring surface (Hall element surface) 2a of the magnetic field measuring element 16 are the same in their magnitudes. In FIG. 11, there are shown: a magnetic field distribution 64 along the Z-axis of the radial magnetic fields Br received by the magnetic field measuring surface (Hall element surface) 2a of the magnetic field measuring element 15 in FIG. 9; and a magnetic field distribution 65 along the Z-axis of the radial magnetic fields Br received by the magnetic field measuring surface (Hall element surface) 2a of the magnetic field measuring element 16 in FIG. 10. In FIG. 11, the ordinate represents the radial magnetic field Br, and the abscissa represents a position in the Z-direction. Symbols a, b and c indicate the positions of the a-plane, the b-plane and the c-plane, respectively. Note that, although the description has been made so far using three points at the a-plane to the c-plane, as representatives, a continuous distribution is drawn in FIG. 11 supposing that a Z-axial distribution has been measured at more points.

In FIG. 1/1, the magnetic field distribution 64 is a magnetic field distribution measured by a Hall element corresponding to the magnetic field measuring element 15 inclined as shown in FIG. 9, and the magnetic field distribution 65 is a magnetic field distribution measured by a Hall element corresponding to the magnetic field measuring element 16 inclined as shown in FIG. 10. As shown in FIG. 11, the intersection point between the magnetic field distribution 64 and the magnetic field distribution 65 is placed at a position corresponding to the b-plane which is the inter-coil center position as described previously. In the case of FIG. 11, the b-plane and the inter-coil center position coincide with each other. As shown in FIG. 11, the inter-coil center position can be detected from the intersection point between the magnetic field distribution 64 in which the radial magnetic field Br before rotation varies in the Z-direction and the magnetic field distribution 65 in which the radial magnetic field Br after rotation by 180 degrees varies in the Z-direction.

It is noted that, although the radial magnetic field Br in the magnetic field distribution 64 is zero at the a-plane and the radial magnetic field Br in the magnetic field distribution 65 is zero at the c-plane, this is because they are set to be zero as an example here, and thus they are not always zero. Namely, such an illustration is selected as an example here in which, as described previously, a plane parallel to the magnetic field measuring surface (Hall element surface) and the direction of magnetic field coincide with each other at the a-plane in FIG. 9 or the c-plane in FIG. 10, and this results in what is shown in FIG. 11.

Figure 12:
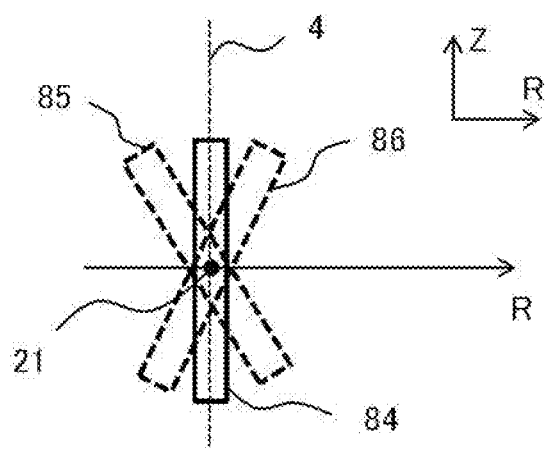
FIG. 12 is a diagram showing cases where there is an angular error in inclination of the magnetic field measuring element.
Figure 13:
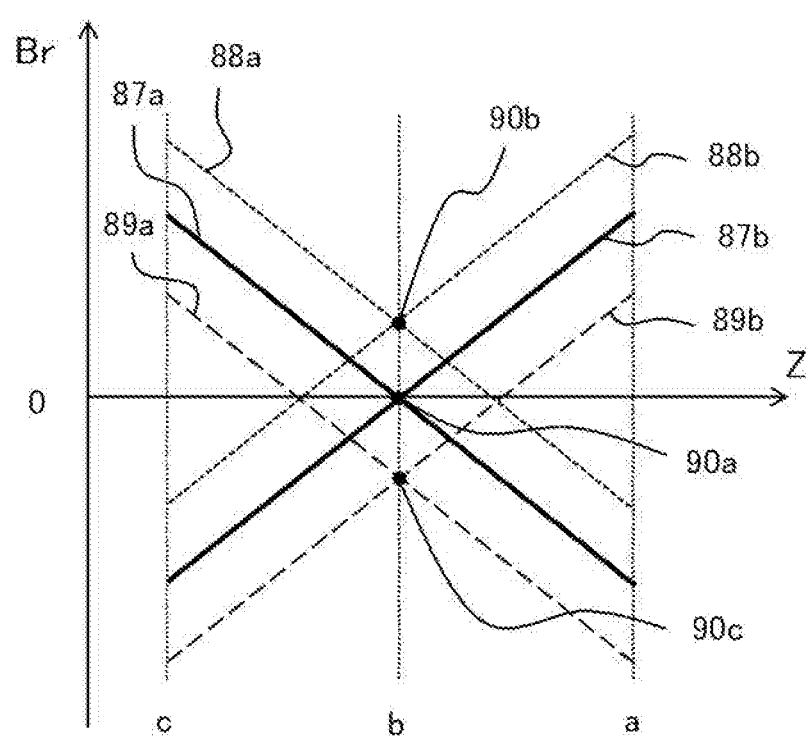
FIG. 13 is a diagram showing Z-direction distributions of radial magnetic-field components measured by the magnetic field measuring element in the states in FIG. 12.
Figure 14:
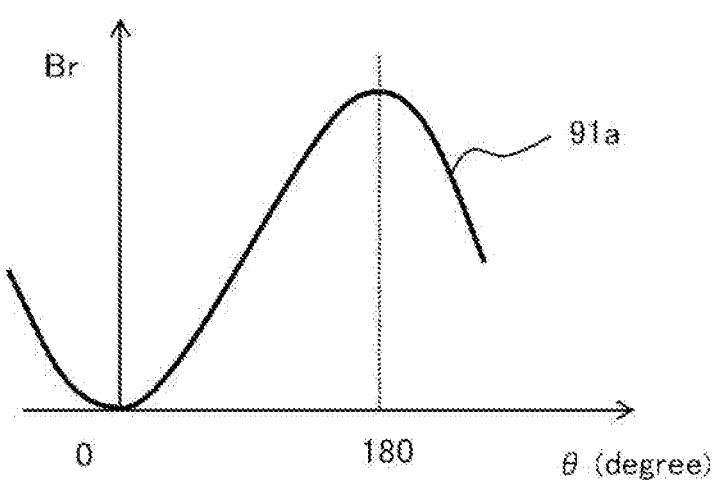
FIG. 14 is a diagram showing an angular dependency of radial magnetic-field components when the magnetic field measuring element is rotated in an a-plane in FIG. 5.
Figure 15:
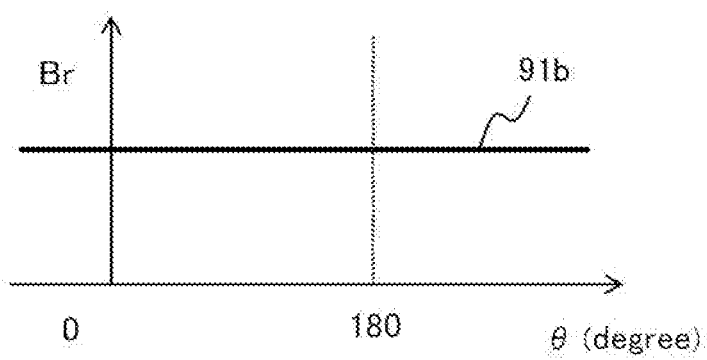
FIG. 15 is a diagram showing an angular dependency of radial magnetic-field components when the magnetic field measuring element is rotated in a b-plane in FIG. 5.
Figure 16:
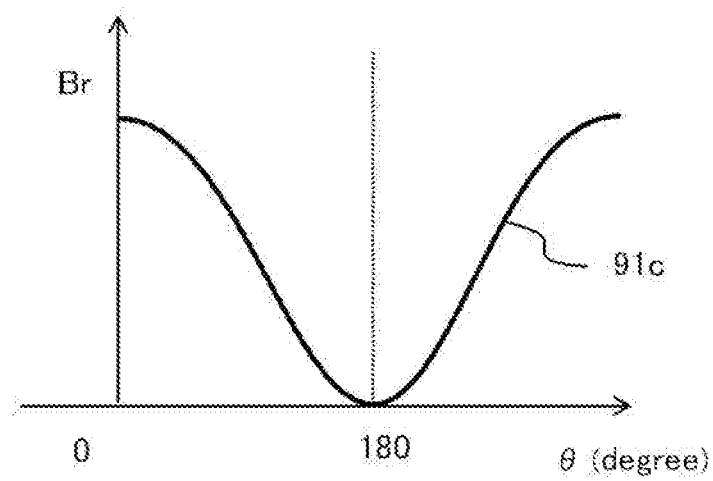
FIG. 16 is a diagram showing an angular dependency of radial magnetic-field components when the magnetic field measuring element is rotated in a c-plane in FIG. 5.

Next, description will be made about a case where there is an angular error relative to a preset angle in the inclination of the magnetic field measuring element (Hall element). A diagram that shows an example of an inclination error of the magnetic field measuring element (Hall element) is FIG. 12. FIG. 12 is a diagram showing cases where there is an angular error in the inclination of the magnetic field measuring element, and FIG. 13 is a diagram showing Z-direction distributions of the radial magnetic-field components measured by the magnetic field measuring element in the states in FIG. 12. FIG. 14 is a diagram showing an angular dependency of radial magnetic-field components when the magnetic field measuring element is rotated in the a-plane in FIG. 5. FIG. 15 is a diagram showing an angular dependency of radial magnetic-field components when the magnetic field measuring element is rotated in the b-plane in FIG. 5, and FIG. 16 is a diagram showing an angular dependency of radial magnetic-field components when the magnetic field measuring element is rotated in the c-plane in FIG. 5.

In order to study the inclination error of the magnetic field measuring element (Hall element), let's assume a case where the error occurs due to the rotation of the magnetic field measuring element (Hall element) around the rotation axis 21 that is an axis perpendicular to the paper plane. In FIG. 12, the magnetic field measuring element 84 is a Hall element directed in the vertical direction (Z-direction), the magnetic field element 85 is the Hall element inclined as its upper side goes left in the figure, and the magnetic field element 86 is the Hall element inclined as its upper side goes right in the figure. Note that, in FIG. 12, there is also shown the rotation axis 4 for rotating the magnetic field measuring element 2 at the time the magnetic field distributions 64, 65 shown in FIG. 11 are measured.

In FIG. 13, a magnetic field distribution 87a indicates a Z-direction dependency of the radial magnetic fields Br measured by the magnetic field measuring element 84. A magnetic field distribution 87b indicates a Z-direction dependency of the radial magnetic fields Br measured by the magnetic field measuring element 84 after being rotated by 180 degrees about the rotation axis 4. In FIG. 13, symbols a, b and c indicate the positions in the Z-direction, of the a-plane, the b-plane and the c-plane, respectively. A magnetic field distribution 88a indicates a Z-direction dependency of the radial magnetic fields Br measured by the magnetic field measuring element 85, and a magnetic field distribution 88*b* indicates a Z-direction dependency of the radial magnetic fields Br measured by the magnetic field measuring element 85 after being rotated by 180 degrees about the rotation axis 4. Likewise, a magnetic field distribution 89*a* indicates a Z-direction dependency of the radial magnetic fields Br measured by the magnetic field measuring element 86, and a magnetic field distribution 89*b* indicates a Z-direction dependency of the radial magnetic fields Br measured by the magnetic field measuring element 86 after being rotated by 180 degrees about the rotation axis 4.

The Z-position of an intersection point 90*a* between the magnetic field distribution 87*a* and the magnetic field distribution 87*b* corresponds to the inter-coil center position measured by the magnetic field measuring element 84. Likewise, the Z-position of an intersection point 90*b* between the magnetic field distribution 88*a* and the magnetic field distribution 88*b* corresponds to the inter-coil center position measured by the magnetic field measuring element 85, and the Z-position of an intersection point 90*c* between the magnetic field distribution 89*a* and the magnetic field distribution 89*b* corresponds to the inter-coil center position measured by the magnetic field measuring element 86. As shown in FIG. 13, the intersection points 90*b*, 90*a*, 90*c* are at the same Z-position and thus, even if an inclination occurs in the magnetic field measuring element 2, the inter-coil center positions indicates the same position. Namely, in accordance with the magnetic field measuring method according to Embodiment 1, if an angle from the perpendicular direction (Z-direction, coil-axial direction), with which the magnetic field measuring element (Hall element) is placed, is different to the preset angle, no displacement occurs in the Z-position of the intersection point irrespective of the inclination error from the perpendicular direction (Z-direction, coil-axial direction) in the magnetic field measuring element (Hall element). Thus, according to the magnetic field measuring method of Embodiment 1, if there is an inclination error in the placement of the magnetic field measuring element (Hall element), this does not make the measurement result of the inter-coil center position different, so that it is possible to highly accurately determine the inter-coil center position.

It is noted that, according to the magnetic field measuring method of Embodiment 1, since the magnetic field measuring element (Hall element) is required to be rotated by 180 degrees, such a case may arise where a rotational error (rotation angle error) occurs at the time of rotation around the rotation axis 4. In order to minimize the rotational error (rotation angle error) when the magnetic field measuring element is rotated around the rotation axis 4, it is, for example, preferable to elongate the rotatable rod 72 in FIG. 2. When the rotatable rod 72 becomes longer, a displacement of the magnetic field measuring element 2 appears as if it becomes larger, so that the displacement can be determined highly accurately and the displacement can be corrected highly accurately.

Further, the accuracy of a rotation angle of the magnetic field measuring element 2 around the rotation axis 4 is not important. This is because, as long as the accuracy of the rotation axis 4 is ensured, a constant magnetic field is detected at the inter-coil center position irrespective of the rotation angle as shown in FIG. 15. This will be described in detail later. Note that, in the above description, it is described that the element is required to be rotated by 180 degrees; however, the rotation angle is not necessarily required to be 180 degrees, and may be another angle. Even when an up-down distribution (Z-direction distribution) measured at the other angle is used, the same magnetic field is detected at the coil up-down center (inter-coil center position), so that the intersection point between the distributions along the up-down direction measured at the different rotation angles, corresponds to the coil up-down center. Note that, in many cases, an encoder or the like is used for detecting the rotation angle. In the foregoing, the description has been made about the case where up-down distributions are measured at two different rotation angles; however, they may be measured at much more plural rotation angles.

It is noted that when, as shown in FIG. 17, the magnetic-field-measuring-element supporting table 71 is provided with the rotatable rod 92, it is possible, by rotating the magnetic field measuring element 2 around the rotatable rod 92, to freely change the intensity of the radial magnetic field Br at the intersection position between the distributions before and after rotation around the rotation axis 4, as shown in FIG. 13. Namely, with respect to the Z-direction distribution of the radial magnetic-field components in FIG. 11, it is possible to move the intersection point (intensity of the radial magnetic field Br) up and down, to thereby set a desired detection determining value at the time the inter-coil center position is to be determined.

Such a magnetic field measuring method in which the magnetic field measuring element 2 is placed on at least two rotation positions (before rotation and after rotation) with respect to the rotation axis 4, is effective when it is difficult to continuously rotate the magnetic field measuring element 2 in a magnetic field. In the examples described so far, two rotation angles of 0 degree and 180 degrees are provided for the magnetic field measuring element 2.

When it is difficult to rotate the magnetic field measuring element 2 in a magnetic field, it is preferable to measure the magnetic fields by moving the magnetic field measuring element 2 at the angle of 0 degree, up and down in the Z-direction, and then to once nullify the magnetic fields and, in addition, to rotate the magnetic field measuring element 2 up to 180 degrees, and thereafter, to measure the radial-magnetic-field distribution by moving the magnetic field measuring element 2 up and down in the Z-direction after raising the magnetic fields. When the magnetic field distribution of the measuring target coil is measured while the magnetic field measuring element 2 is being moved up and down in the Z-direction, at least twice before and after change of the rotation angle, and then two magnetic field distributions with respect to the different rotation angles (for example, 0 degree and 180 degrees) are compared with each other, it is possible to determine the inter-coil center position of the measuring target coil.

Although in the foregoing, the description has been made on an example in the case where two rotation angles are provided for the magnetic field measuring element 2, the magnetic field measuring element 2 may be rotated continuously. In the following, an example therefor will be described. Namely, the magnetic field measuring element 2 may be moved up and down in the Z-direction while being rotated about the rotation axis 4. Examples of the radial magnetic fields Br measured in that case are shown in FIG. 14 to FIG. 16. Magnetic field distributions 91*a*, 91*b*, 92*c* are magnetic field distributions when the element is rotated about the rotation axis 4 in the respective planes (the a-plane, the b-plane, the c-plane) in FIG. 9 and FIG. 10, respectively.

In FIG. 14 to FIG. 16, the abscissa represents an angle θ when the magnetic field measuring element 2 is rotated around the rotation axis 4, and the ordinate represents the radial magnetic field Br. FIG. 14 shows an angular dependency of the magnetic fields received at the a-plane by the magnetic field measuring element 2. FIG. 15 shows an angular dependency of the magnetic fields received at the b-plane by the magnetic field measuring element 2, and FIG. 16 shows an angular dependency of the magnetic fields received at the c-plane by the magnetic field measuring element 2.

In the description of FIG. 9 and FIG. 10, it is described that, at the a-plane, the magnetic field measured when the angle of the magnetic field measuring element (Hall element) is 0 degree (before rotation) is zero, and that, at the a-plane, the magnetic field measured when the magnetic field measuring element (Hall element) has been rotated by 180 degrees becomes maximum. Accordingly, as is shown by the magnetic field distribution 91$a$, the angular dependency of the radial magnetic fields Br at the a-plane is provided as a distribution in which a minus COS-component (cosine component) is superimposed on a constant magnetic-field component (constant magnetic-field value). The constant magnetic-field value is a value of the magnetic field component at 90 degrees.

On the other hand, as can be seen from FIG. 15, at the b-plane, the magnetic field distribution along the θ-direction is stable without depending on the angle. This is the reason why the accuracy of the rotation angle for the rotation around the rotation axis 4 is not important, as described above. Note that in the description of FIG. 9 and FIG. 10, it is described that, at the b-plane, the magnetic fields measured before and after rotation by the magnetic field measuring element (Hall element) are different in their directions but are the same in their magnitudes.

Furthermore, in the description of FIG. 9 and FIG. 10, it is described that, at the c-plane, the magnetic field measured when the angle of the magnetic field measuring element (Hall element) is 0 degree (before rotation) is maximum, and that, at the c-plane, the magnetic field measured when the magnetic field measuring element (Hall element) has been rotated by 180 degrees becomes zero. Accordingly, at the c-plane, the magnetic field is maximum when the angle of the magnetic field measuring element (Hall element) is 0 degree and the magnetic field is zero when the angle is 180 degrees, so that, as is shown by the magnetic field distribution 91$c$, a distribution in which a COS-component (cosine component) is superimposed on a constant magnetic-field component (constant magnetic-field value) is provided. The constant magnetic-field value is a value of the magnetic field component at 90 degrees.

In conclusion, if the magnetic fields measured by the magnetic field measuring element (Hall element) have a minus COS-waveform (magnetic field distribution 91$a$), it is found that a reference plane of the measuring target coil is placed on an upper side in the Z-direction (positive side in the Z-direction) relative to the inter-coil center plane 9. Furthermore, if the magnetic fields measured by the magnetic field measuring element (Hall element) have a plus COS-waveform (magnetic field distribution 91$c$), it is found that the reference plane of the measuring target coil is placed on a lower side in the Z-direction (negative side in the Z-direction) relative to the inter-coil center plane 9 (coil up-down center plane). Accordingly, the vertical relationship between the inter-coil center plane 9 and the reference plane of the measuring target coil is found based on the shape of the waveform of the magnetic fields measured by the magnetic field measuring element (Hall element). Further, if the shape of the waveform of the magnetic fields measured by the magnetic field measuring element (Hall element) becomes stable so that the COS-component or the SIN-component (sine component) is zero, the currently present reference plane of the measuring target coil is the inter-coil center plane 9. So far, the description has been made about the measurement performed on the radial axis 62 in FIG. 2. The measurement may be performed on a radial axis other than the radial axis 62, namely, by moving the element up and down at a position with an angle established by rotating the radial axis 62 with respect to the coil axis 3. Further, with respect to the radial direction, so far, the measurement has been performed only at one point; however, the measurement may be performed at multiple points. Likewise, the measurement may be performed at multiple angles established by rotating the rotation axis 4. When the measurement is performed at multiple points, the accuracy is improved.

In this manner, the inter-coil center plane 9 can be measured by the magnetic field measuring method of Embodiment 1 described so far. Thus, it suffices to execute adjustment of the relative positions of the first coil 60 and the second coil 61 in the split solenoid coil 7 so that the inter-coil center plane 9 and a magnetic-field-measurement reference plane (the reference plane of the measuring target coil) coincide with each other, and this makes it possible to highly accurately adjust the third-type coil displacement described previously.

So far, the description has been made about the magnetic field as a radial component (radial magnetic field Br). In the following, description will be made about the capability of detecting the inter-coil center position using a coil-axial magnetic field Bz that is a magnetic field as a coil-axial component.

Figure 19:
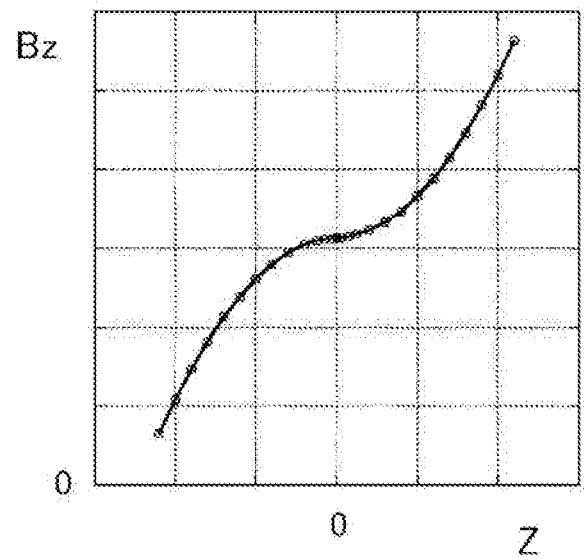
FIG. 19 is a diagram showing an axial (Z-direction) distribution of coil-axial magnetic field components of the split solenoid coil in FIG. 5.

FIG. 19 is a diagram showing an axial (Z-direction) distribution of the coil-axial magnetic fields of the split solenoid coil in FIG. 5. The distribution of the coil-axial magnetic fields Bz shown in FIG. 19 is a distribution along the Z-direction of the coil-axial magnetic fields Bz at a position apart by a given offset length r0 from the Z-axis. Around a position indicative of the inter-coil center position (the position corresponding to Z=0, or zero position), the coil-axial magnetic fields Bz become flat, so that it is difficult to detect the inter-coil center position. Also, in the case of a superconductive coil, since the magnetic field around the zero position is several Tesla and thus the relative ratio of a change in magnetic field is small with respect to the magnetic field intensity, detection of the zero position by using the coil-axis magnetic field Bz results in poor accuracy. Note that, when, as shown by the magnetic field measuring element 84 in FIG. 12, the magnetic field measuring element 2 placed to be parallel to the rotation axis 4, namely, the magnetic field measuring element 2 whose placement angle relative to the rotation axis 4 is zero, is used, as shown by the intersection point 90$a$ in FIG. 13, the radial magnetic field Br is zero at the inter-coil center position and also the sign of the radial magnetic field Br differs between that in the upper side (positive side) in the Z-direction and that in the lower side (negative side) in the Z-direction, so that the inter-coil center position can easily be detected.

Figure 20:
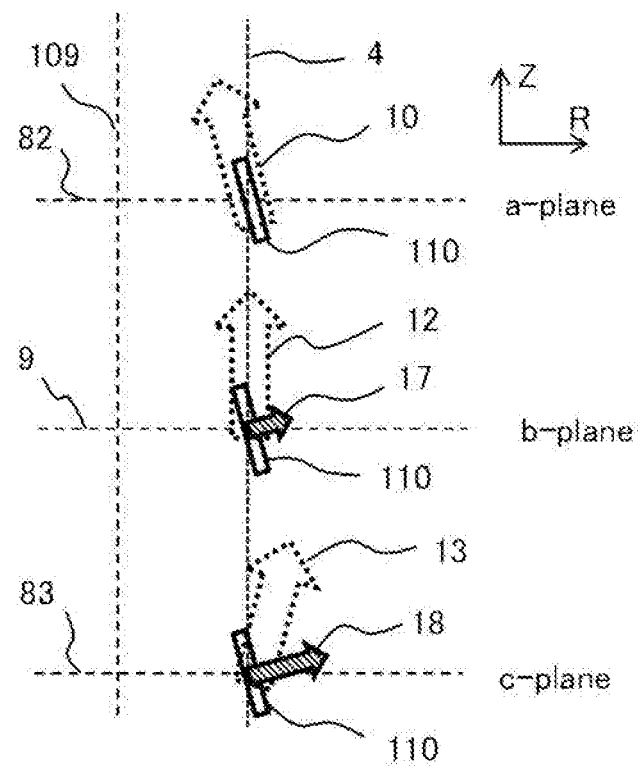
FIG. 20 is a diagram showing magnetic field components in a surface-perpendicular direction of a magnetic field measuring element of a comparative example before being rotated.
Figure 21:
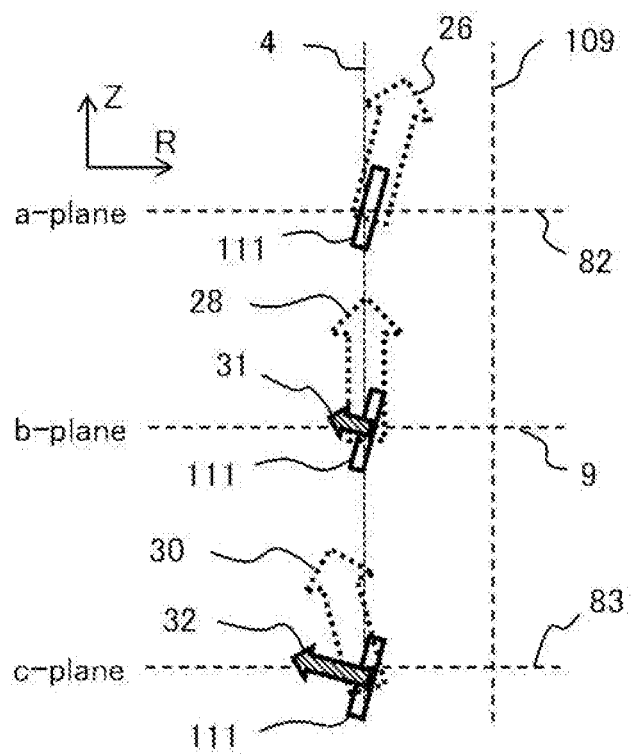
FIG. 21 is a diagram showing magnetic field components in the surface-perpendicular direction of the magnetic field measuring element of the comparative example after being rotated.
Figure 22:
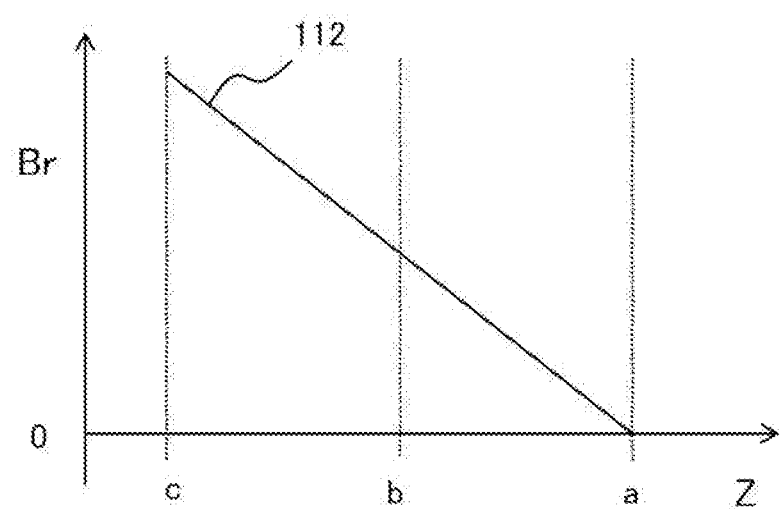
FIG. 22 is a diagram showing a Z-direction distribution of radial magnetic-field components measured by the magnetic field measuring element of the comparative example.
Figure 23:
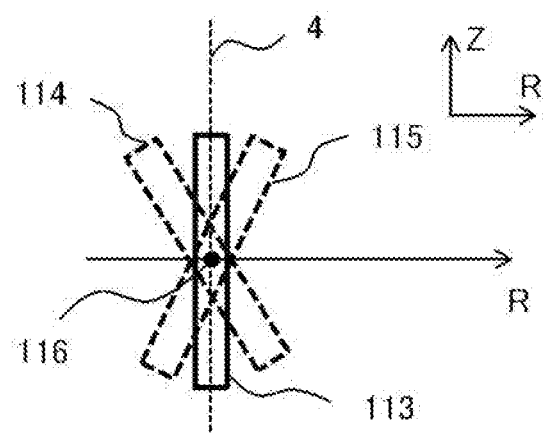
FIG. 23 is a diagram showing cases where there is an angular error in inclination of the magnetic field measuring element of the comparative example.
Figure 24:
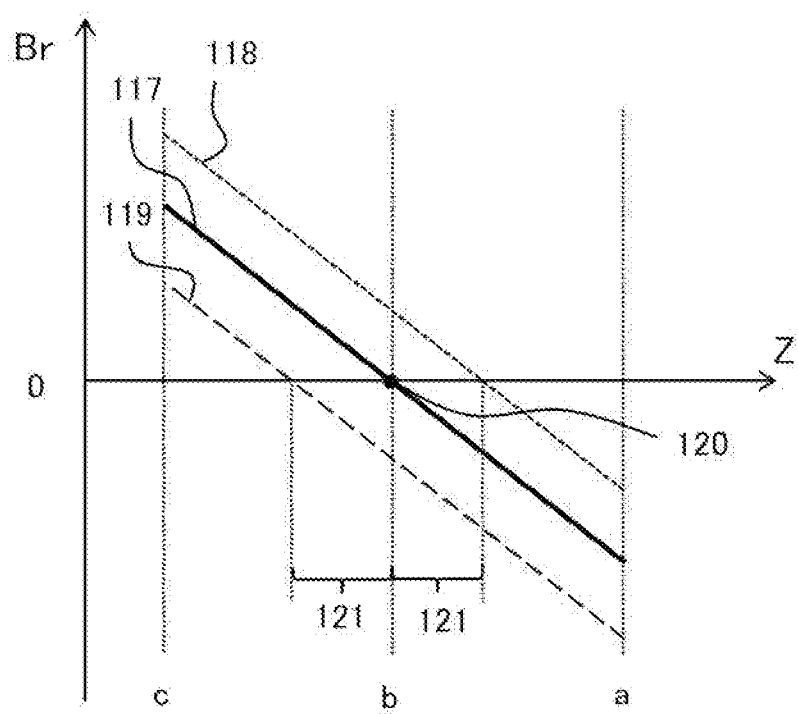
FIG. 24 is a diagram showing Z-direction distributions of radial magnetic-field components measured by the magnetic field measuring element in the states in FIG. 23.

Next, the magnetic field measuring method of Embodiment 1 will be compared with a magnetic field measuring method to be performed by a magnetic field measuring apparatus of a comparative example that corresponds to the magnetic field measuring apparatus of Patent Document 1. FIG. 20 is a diagram showing magnetic field components in a surface-perpendicular direction of a magnetic field measuring element of a comparative example before being rotated, and FIG. 21 is a diagram showing magnetic field components in the surface-perpendicular direction of the magnetic field measuring element of the comparative example after being rotated. FIG. 22 is a diagram showing a Z-direction distribution of radial magnetic-field components measured by the magnetic field measuring element of the comparative example, and FIG. 23 is a diagram showing cases where there is an angular error in inclination of the magnetic field measuring element of the comparative example, FIG. 24 is a diagram showing Z-direction distributions of radial magnetic-field components measured by the magnetic field measuring element in the states in FIG. 23. The magnetic field measuring apparatus of the comparative example is an apparatus that measures magnetic fields while rotating the magnetic field measuring element (Hall element) placed on a disk by 360 degrees only around a rotation axis 109 which is also a reference axis of the disk (corresponding to the coil axis 3). According to the magnetic field measuring apparatus of the comparative example, a magnetic field measuring element 110 does not rotate about the rotation axis 4 as does in the magnetic field measuring apparatus 1 of Embodiment 1, so that the inter-coil center position can not be detected. Namely, according to the method described in Patent Document 1, the inter-coil center position can not be detected. In the following, description will be made about that.

Shown in FIG. 20 are magnetic fields received by the magnetic field measuring element 110 whose angle around the rotation axis 109 is zero degree. This FIG. 20 corresponds to FIG. 9. A magnetic field component received at the b-plane by the magnetic field measuring surface (Hall element surface) of the magnetic field measuring element 110 is the magnetic field component 17. A magnetic field component received at the c-plane by the magnetic field measuring surface (Hall element surface) of the magnetic field measuring element 110 is the magnetic field component 18. The magnetic field measuring apparatus of the comparative example has no function of rotating the magnetic field measuring element 110 at the rotation axis 4, and just has a function of rotating the magnetic field measuring element 110 about the rotation axis 109 (Z-axis) of the magnetic field measuring apparatus which is also the reference axis (corresponding to the coil axis 3). In FIG. 21, the magnetic field measuring element 110 when its angle around the rotation axis 109 is 180 degrees is specified as a magnetic field measuring element 111. When the magnetic fields are measured while the magnetic field measuring element 111 is moved up and down in the Z-direction, this results in what is shown in FIG. 21.

In FIG. 21, magnetic field vectors 26, 28, 30 along a magnetic flux line of the coil are the same as the magnetic field vectors along the magnetic flux line 8 shown on the left side in FIG. 5. Magnetic field vectors at the a-plane, b-plane and c-plane are the magnetic field vectors 26, 28, 30, respectively. A magnetic field component 31 is a magnetic field component in the surface-perpendicular direction received at the b-plane by the magnetic field measuring surface of the magnetic field measuring element 111. A magnetic field component 32 is a magnetic field component in the surface-perpendicular direction received at the c-plane by the magnetic field measuring surface of the magnetic field measuring element 111.

The magnetic field components in FIG. 21 received by the magnetic field measuring surface of the magnetic field measuring element 111 are the same as those in FIG. 20 in their magnitudes, because the magnetic field measuring element 2 is placed anti-symmetrically to that in FIG. 20 about the Z-axis (rotation axis 109) and thus the direction of the magnetic field is also antisymmetric about the Z-axis (rotation axis 109). Namely, the magnetic field component received at the a-plane by the magnetic field measuring surface of the magnetic field measuring element 111 is zero, and the magnetic field component received at the c-plane by the magnetic field measuring surface of the magnetic field measuring element 111 becomes maximum. A magnetic field distribution in the case where the up-down movement in the direction of the Z-axis is applied is shown in FIG. 22. This FIG. 22 corresponds to FIG. 11 according to the magnetic field measuring method of Embodiment 1. According to the magnetic field measuring apparatus of the comparative example, the distributions of the radial magnetic fields Br in FIG. 20 and FIG. 21 coincide with each other, and they are each provided as the magnetic field distribution 112. Thus, there is no intersection point because, unlike FIG. 11 in Embodiment 1, the characteristics before and after rotation with respect to the rotation axis 109 are the same, so that the inter-coil center position can not be determined.

It is noted that, in FIG. 22, at a position "a" corresponding to the position of the a-plane, the radial magnetic field Br becomes zero as an example here, and this is because, at the a-plane in FIG. 20 and FIG. 21, such an illustration is selected as an example here in which the direction of the Hall element surface of the magnetic field measuring element 110, 111 and the direction of the magnetic field (magnetic field vector 10, 26) are the same.

Even in the case of the magnetic field measuring apparatus of the comparative example, if the magnetic field measuring element can be directed perfectly in a direction parallel to the rotation axis 109, namely, in the Z-direction (perpendicular direction in FIG. 20, FIG. 21), it is possible to determine the inter-coil center position by detecting the zero-magnetic-field position of the radial magnetic field Br. This method is a method which has been heretofore used for determining the inter-coil center position. However, according to this method, in the case where there is an angular error from an axis (corresponding to the rotation axis 4 in Embodiment 1) that passes through the magnetic field measuring element (Hall element) and that is parallel to the rotation axis 109, namely, when there is an error in the placement of the magnetic field measuring element (Hall element), an error occurs in the inter-coil center position. This case is exemplified in FIG. 23 and FIG. 24.

In FIG. 24, a magnetic field distribution 117 shows a Z-direction dependency of the redial magnetic fields Br measured by the magnetic field measuring element 113, a magnetic field distribution 118 shows a Z-direction dependency of the redial magnetic fields Br measured by the magnetic field measuring element 114, and a magnetic field distribution 119 shows a Z-direction dependency of the redial magnetic fields Br measured by the magnetic field measuring element 115. A rotation axis 116 in FIG. 23 that is perpendicular to the paper plane is a virtual rotation axis set for illustrating the angular error in the magnetic field measuring element 113, 114, 115 of the comparative example. In FIG. 24, a zero point 120 is a zero point in the magnetic field distribution 117 which is a Z-position corresponding to the inter-coil center position. Each error 121 shown in FIG. 24 is an error occurring in the measurement of the inter-coil center position. In FIG. 24, positions a, b and c in the Z-direction are the positions of the a-plane, the b-plane and the c-plane in FIG. 20 and FIG. 21, respectively.

As shown by the magnetic field distribution 117 in FIG. 24, at the inter-coil center position, the coil-induced magnetic field is directed in the Z-direction (perpendicular direction in FIG. 20, FIG. 21), so that the radial magnetic field Br is zero. Accordingly, when the magnetic field measuring surface (Hall element surface) of a magnetic field measuring element is directed perpendicularly as shown by the magnetic field measuring element 113, the magnetic field detected by the magnetic field measuring element (Hall element) is zero, so that the inter-coil center position can be detected.

However, when, in the placement of the magnetic field measuring element (Hall element), there is an angular error relative to the Z-direction, the error 121 occurs in the measurement of the inter-coil center position as shown by the magnetic field distribution 118 or the magnetic field distribution 119 in FIG. 24. As preciously described, the Hall element has a size as small as several millimeters, so that it is difficult to highly accurately direct the Hall element surface in the Z-direction (perpendicular direction in FIG. 20).

In contrast, according to the magnetic field measuring apparatus 1 and the magnetic field measuring method of Embodiment 1, as illustrated using FIG. 12 and FIG. 13, the respective intersection points between the magnetic field distributions before and after rotation with respect to the rotation axis 4 indicate a fixed position in the Z-direction without depending on the inclination of the magnetic field measuring element (Hall element) relative to the Z-direction, namely, even if there is an angular error in the magnetic field measuring element (Hall element), so that the inter-coil center position can be determined highly accurately.

Figure 25:
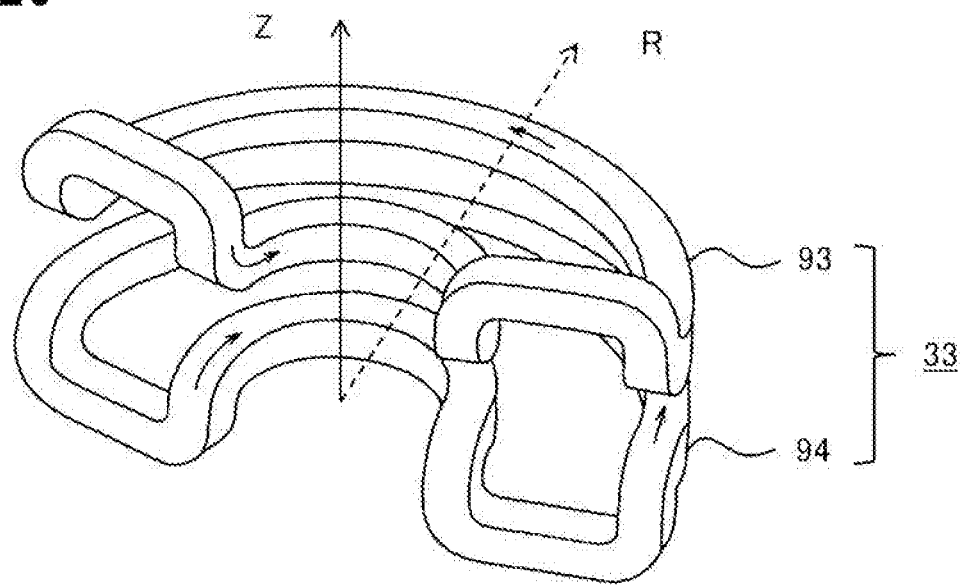
FIG. 25 is a diagram showing a banana-shaped coil as a measuring target of the invention.
Figure 26:
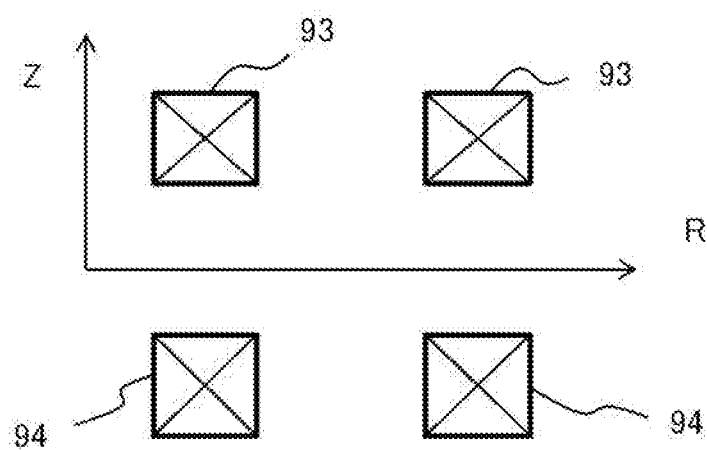
FIG. 26 is a diagram showing a cross section of the banana-shaped coil in FIG. 25.

So far, the magnetic-field inducing coil is exemplified by the split solenoid coil 7. The magnetic field measuring method of Embodiment 1 may be applied to another coil if it is symmetric in the coil-axial direction. Such a case is exemplified by FIG. 25. FIG. 25 is a diagram showing a banana-shaped coil as a measuring target of the invention, and FIG. 26 is a diagram showing a cross section of the banana-shaped coil in FIG. 25. A banana-shaped coil 33 includes a first coil 93 and a second coil 94. The banana-shaped coil 33 is asymmetric in the shape in the radial direction (R-direction) but is symmetric in the shape in the Z-direction. When, as shown in FIG. 26, the cross section of the first coil 93 and the cross section of the second coil 94 are symmetric to each other in the Z-direction, the magnetic field distribution in the Z-direction also expands at its middle like the magnetic field distribution (see, FIG. 5) of the split solenoid coil 7, and the magnitudes of the magnetic fields are up-down symmetric in the Z-direction about the b-plane as the middle plane. Thus, with respect also to the banana-shaped coil 33, it is possible using the magnetic field measuring method of Embodiment 1 to detect vertical displacements of the first coil 93 and the second coil 94 from the inter-coil center plane.

It is noted that, although an example with the first coil and the second coil has been shown so far, it may instead be a single solenoid coil as shown in FIG. 2. Further, it may instead be four or more even number of coils placed to be up-down symmetric. Furthermore, ever when it is odd number of coils, or even number of coils that are up-down asymmetric, if these coils have at least one magnetic field distribution that is almost symmetric along the up-down direction, the magnetic field measuring method of Embodiment 1 is applicable thereto. Note that, even when the measuring target coil is a combination coil provided with a plurality of coils having a common coil axis and its distribution along the coil axis of the radial magnetic fields with respect to at least one radial direction, is symmetric about a plane perpendicular to the coil axis, a center position in the coil-axial direction in the radial-magnetic-field distribution is the inter-coil center position, like the example with the first coil and the second coil. Note that a coil pair provided with the first coil and the second coil is also a combination coil. When the measuring target coil is a single solenoid coil, the center position in the coil-axial direction in the radial-magnetic-field distribution is placed inside the coil, and thus it is referred to as a coil center position.

It is noted that, in the magnetic field measuring method in Patent Document 2, the object to be measured is a CRT (Cathode Ray Tube) coil, and its coil shape is asymmetric along the coil axis (Z-axis) and also the magnetic field distribution along the coil axis (Z-axis) is asymmetric. Thus, it is unable to apply the method of determining the inter-coil center position according to Embodiment 1 that takes advantage of the situation where the magnetic field distribution is symmetric along the coil axis (Z-axis) about the plane perpendicular to the coil axis.

As described above, the magnetic field measuring method of Embodiment 1 is a magnetic field measuring method in which, with respect to a measuring target coil (split solenoid coil 7, banana-shaped coil 33) which is a combination coil provided with a plurality of coils (first coil 60, second coil 61) having the common coil axis 3 and whose distribution along the coil axis 3 of radial magnetic fields with respect to at least one radial direction, is symmetric about a plane perpendicular to the coil axis 3, an inter-coil center position is determined that is a center position in the direction of the coil axis in the distribution of the radial magnetic fields. The magnetic field measuring method of Embodiment 1 is characterized by comprising: a first radial-magnetic-field measuring step of using the magnetic field measuring element 2 placed at an offset position radially apart by a set length (offset length r0) from the coil axis 3, to thereby measure, at the offset position, first radial magnetic fields along an offset axis (rotation axis 4) that is parallel to the coil axis 3; a second radial-magnetic-field measuring step of using the magnetic field measuring element 2 after being rotated by a set angle around the offset axis (rotation axis 4), to thereby measure, at the offset position, second radial magnetic fields along the offset axis (rotation axis 4); and a center-position determining step of determining the inter-coil center position on the basis of: a first radial-magnetic-field characteristic (magnetic field distribution 64, 87a, 88a, 89a) that is a characteristic in a direction of the offset axis of the first radial magnetic fields measured in the first radial-magnetic-field measuring step; and a second radial-magnetic-field characteristic (magnetic field distribution 65, 87b, 88b, 89b) that is a characteristic in the direction of the offset axis of the second radial magnetic fields measured in the second radial-magnetic-field measuring step. According to the magnetic field measuring method of Embodiment 1, the inter-coil center position is determined on the basis of the radial-magnetic-field characteristics (magnetic field distributions 64, 65) before and after rotation at the offset position around the offset axis (rotation axis 4) that is parallel to the coil axis 3, so that it is possible to highly accurately determine the inter-coil center position of the combination coil (split solenoid coil 7, banana-shaped coil 33) as the measuring target provided with the plurality of coils (first coil, second coil).

In another aspect, the magnetic field measuring method of Embodiment 1 is a magnetic field measuring method in which, with respect to a measuring target coil (coil 6) whose distribution along the coil axis 3 of radial magnetic fields, is symmetric about a plane perpendicular to the coil axis 3, a vertical coil center (coil center position) along the direction of the coil axis is determined using the distribution of the radial magnetic fields. The magnetic field measuring method of Embodiment 1 is characterized by comprising: a first radial-magnetic-field measuring step of using the magnetic field measuring element 2 placed at an offset position radially apart by a set length (offset length r0) from the coil axis 3, to thereby measure, at the offset position, first radial magnetic fields along an offset axis (rotation axis 4) that is parallel to the coil axis 3; a second radial-magnetic-field measuring step of using the magnetic field measuring element 2 after being rotated by a set angle around the offset axis (rotation axis 4), to thereby measure, at the offset position, second radial magnetic fields along the offset axis (rotation axis 4); and a center-position determining step of determining the vertical coil center (coil center position) on the basis of: a first radial-magnetic-field characteristic (magnetic field distribution 64, 87*a*, 88*a*, 89*a*) that is a characteristic in a direction of the offset axis of the first radial magnetic fields measured in the first radial-magnetic-field measuring step; and a second radial-magnetic-field characteristic (magnetic field distribution 65, 87*b*, 88*b*, 89*b*) that is a characteristic in the direction of the offset axis of the second radial magnetic fields measured in the second radial-magnetic-field measuring step. According to the magnetic field measuring method of Embodiment 1, the vertical coil center (coil center position) is determined on the basis of the radial-magnetic-field characteristics (magnetic field distributions 64, 65) before and after rotation at the offset position around the offset axis (rotation axis 4) that is parallel to the coil axis 3, so that it is possible to highly accurately determine the vertical coil center (coil center position) of a single solenoid coil (coil 6) as the measuring target.

Embodiment 2

Figure 27:
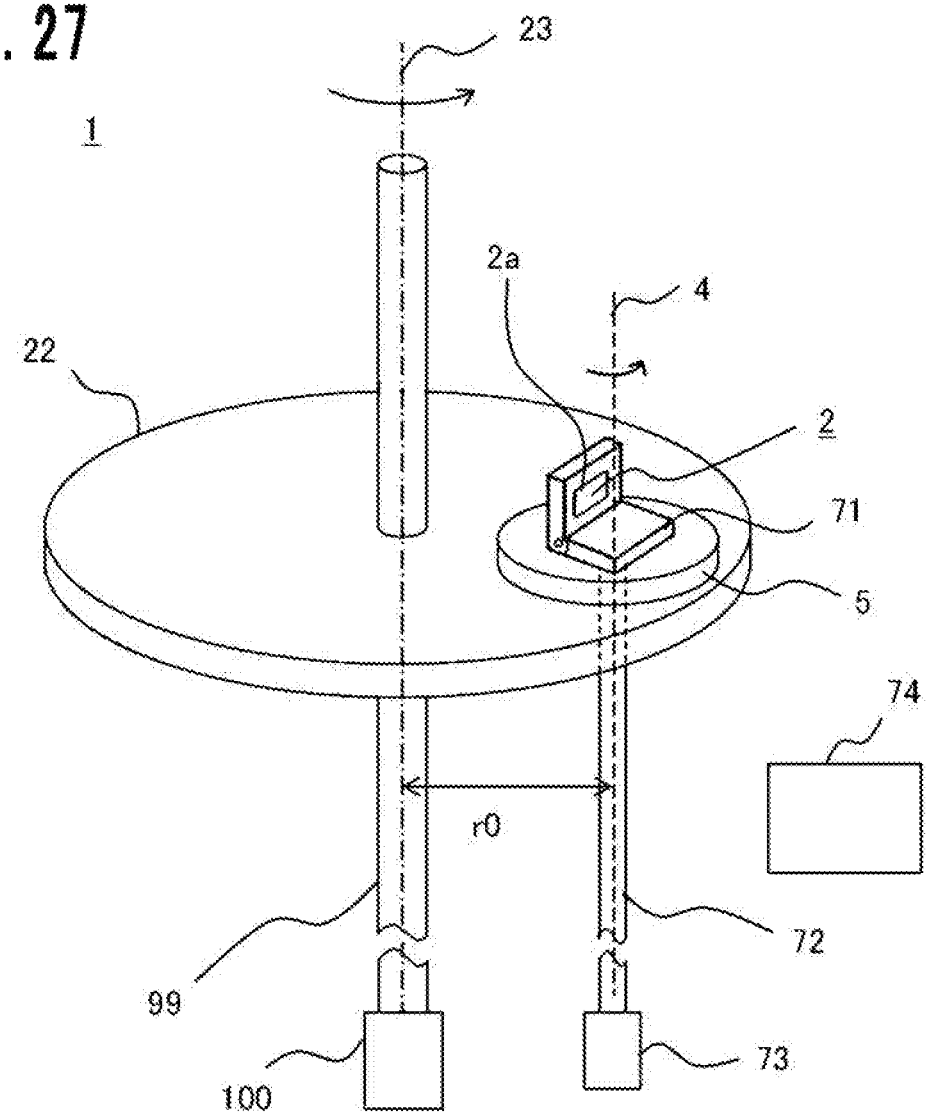
FIG. 27 is a diagram showing a magnetic field measuring apparatus according to Embodiment 2 of the invention.
Figure 28:
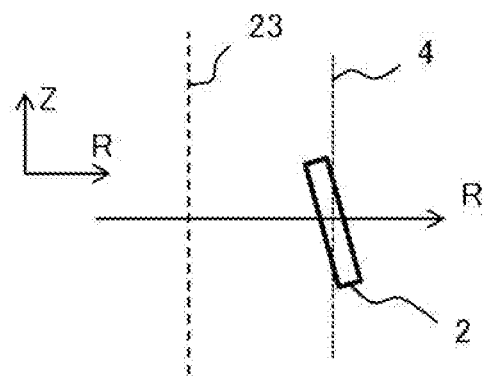
FIG. 28 is a diagram for illustrating a rotation of the magnetic field measuring element in FIG. 27.
Figure 29:
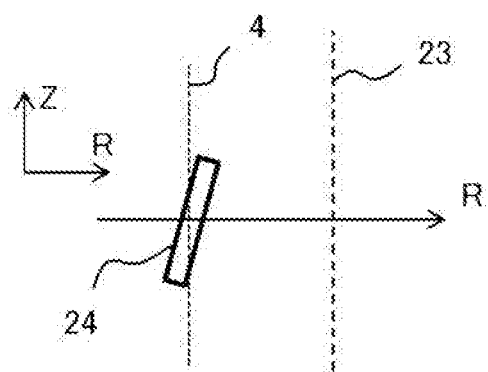
FIG. 29 is a diagram for illustrating a rotation of the magnetic field measuring element in FIG. 27.
Figure 30:
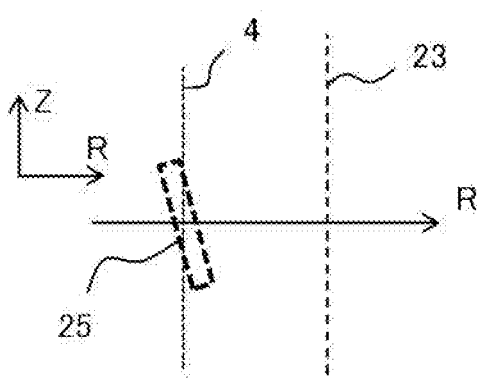
FIG. 30 is a diagram for illustrating a rotation of the magnetic field measuring element in FIG. 27.
Figure 31:
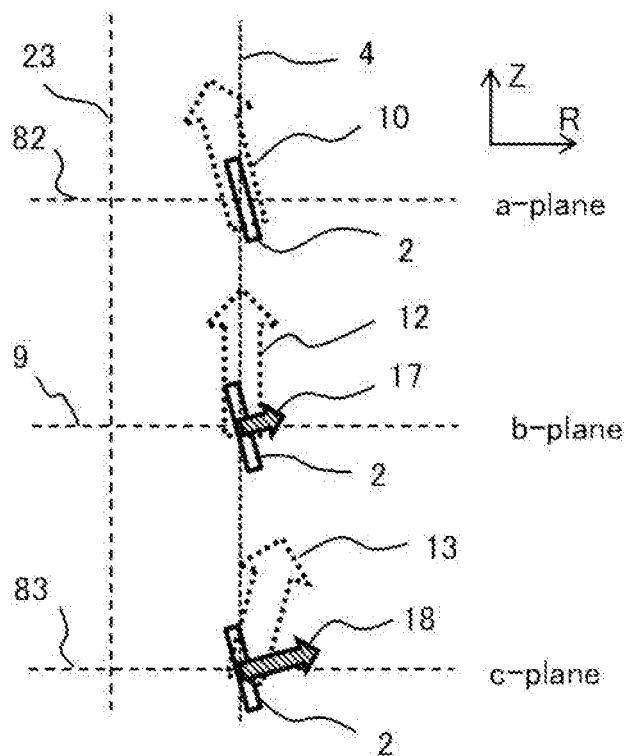
FIG. 31 is a diagram showing magnetic field components in a surface-perpendicular direction of the magnetic field measuring element in FIG. 28.
Figure 32:
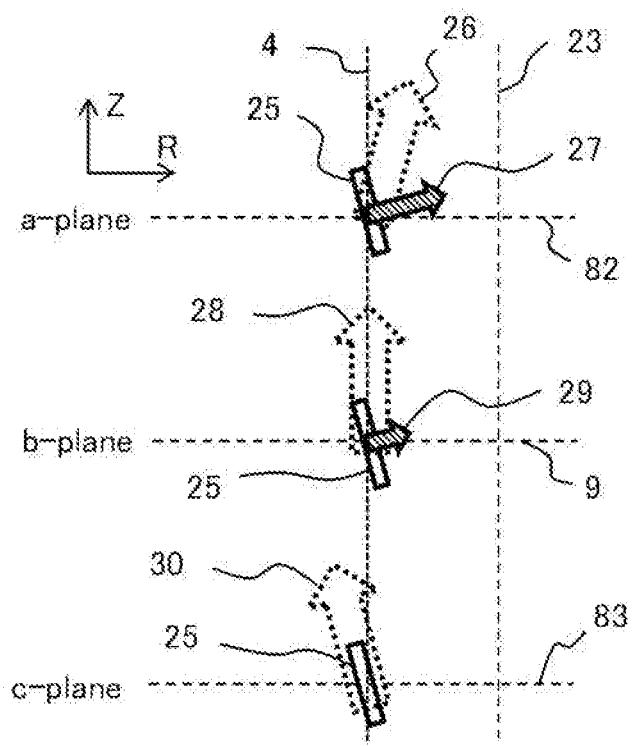
FIG. 32 is a diagram showing magnetic field components in a surface-perpendicular direction of the magnetic field measuring element in FIG. 30.

FIG. 27 is a diagram showing a magnetic field measuring apparatus according to Embodiment 2 of the invention. FIG. 28 to FIG. 30 are diagrams each for illustrating a rotation of the magnetic field measuring element in FIG. 27. FIG. 31 is a diagram showing magnetic field components in a surface-perpendicular direction of the magnetic field measuring element in FIG. 28, and FIG. 32 is a diagram showing magnetic field components in a surface-perpendicular direction of the magnetic field measuring element in FIG. 30. The magnetic field measuring apparatus 1 of Embodiment 1 has been shown as an example in which the magnetic field measuring element 2 does not rotate with respect to the coil axis 3 but rotates around the rotation axis 4. The magnetic field measuring apparatus 1 of Embodiment 2 will be shown as an example in which the magnetic field measuring element 2 rotates with respect to a rotation axis 23 placed at a position that coincides with a coil axis of the measuring target coil. In the apparatus described in Patent Document 1, a Hall element is placed on a rotatable disk; however, in Patent Document 1, the Hall element itself does not rotate on that disk. The magnetic field measuring apparatus 1 of Embodiment 2 has a mechanism by which the magnetic field measuring element 2 rotates on the rotatable disk 22 and also at a position apart radially (R-direction) by an offset length r0 from the rotation axis 23.

The magnetic field measuring apparatus 1 of Embodiment 2 includes: a magnetic field measuring element 2; a magnetic-field-measuring-element supporting table 71 for supporting the magnetic field measuring element 2; a rotary table 5 on which the magnetic-field-measuring-element supporting table 71 is mounted; a disk 22 on which the rotary table 5 is mounted; a rotatable rod 99 fixed to the disk 22; a motor 100 for rotating the rotatable rod 99; a rotatable rod 72 fixed to the rotary table 5, a motor 73 for rotating the rotatable rod 72 and a data processing device 74 for calculating the inter-coil center position from magnetic-field data inputted from the magnetic measuring element 2. The disk 22 rotates with respect to the rotation axis 23 as a reference axis.

Because the magnetic field measuring element 2 rotates around the rotation axis 4 and rotates with respect to the rotation axis 23, the magnetic field measuring apparatus 1 of Embodiment 2 is a magnetic field measuring apparatus having two rotation axes. In the apparatus described in Patent Document 1, the Hall element is placed on the rotatable disk; however, the Hall element itself does not rotate on that disk. The apparatus described in Patent Document 1 can adjust the inclination of the coil axis and the displacement of the coil axis; however, as described in Embodiment 1, it can not accurately determine the inter-coil center position of the coil pair as the measuring target, d so that a displacement of the inter-coil center position in the coil pair relative to the reference plane can not be adjusted. In order to improve the configuration in Patent Document 1, such a mechanism is added, as a basic configuration of this invention, by which the magnetic field measuring element 2 rotates at a position apart radially (R-direction) by the offset length r0 from the rotation axis 23 that is placed at a position that coincides with the coil axis of the measuring target coil, so that it is possible to adjust not only the inclination of the coil axis and the displacement of the coil axis but also the displacement of the inter-coil center position in the coil that is symmetric in the coil-axial direction. Namely, all displacements related to coil positional errors, that is, the first-type coil displacement, the second-type coil displacement and the third-type coil displacement can be adjusted. In Embodiment 2, how to determine the inter-coil center position of the coil pair as a measuring target will be described. Examples of a magnetic field measuring method and a magnetic field measuring apparatus resulting from adding a step of adjusting the inclination of the coil axis and the displacement of the coil axis, to the magnetic field measuring apparatus 1 of Embodiment 2, will be described in Embodiment 4.

Like Embodiment 1, in a coil displacement correction method of Embodiment 2, it is assumed that the first-type coil displacement and the second-type coil displacement have already been corrected by application of the measuring and correcting processes and the like in Patent Document 1. A flowchart of the coil displacement correction method including the magnetic field measuring method according to Embodiment 2 is similar to that of FIG. 1. According to the magnetic field measuring method of Embodiment 2, in Step S1, at an offset position from the coil axis (first offset position), a radial-magnetic-field distribution A is measured. In Step S2, the magnetic field measuring element (Hall element) 2 is rotated by 180 degrees (first-stage rotation) with respect to the rotation axis 23 as the first rotation axis, so that the magnetic field measuring element (Hall element) 2 is placed at an offset position (second offset position) from the coil axis. Then, at the second offset position, the element is rotated by 180 degrees (second-stage rotation) with respect to the rotation axis 4 as the second rotation axis, so that a radial-magnetic-field distribution B is measured. In Step S3, the inter-coil center position is determined from an intersection point between the radial-magnetic-field distribution A and the radial-magnetic-field distribution B. The processing in Steps S4, S5 is the same as in Embodiment 1. Note that the offset length r0 that is a length of radial (R-direction) distance from the rotation axis 23 remains the same in the state after the first-stage rotation. At the first offset position and the second offset position where their offset lengths r0 are the same, the respective magnetic fields in the measuring target coil are the same.

When, at the first offset position, the radial-magnetic-field distribution A is measured, and then, at the second offset position, the radial-magnetic-field distribution B in the case where the rotation axis 4 as the second rotation axis is subjected to rotation to thereby rotate the magnetic field measuring element (Hall element) 2 (second-stage rotation) and then the magnetic field measuring element (Hall element) 2 is moved up and down in the Z-direction, is obtained, it is possible to determine the inter-coil center position in the measuring target coil from the intersection point between the radial-magnetic-field distribution A and the radial-magnetic-field distribution B, so that a displacement of the inter-coil center position can be detected. The principle of how to determine the inter-coil center position is as already described in Embodiment 1 using FIG. 8 to FIG. 16.

In FIG. 28 to FIG. 30, shown is an example in a case where the magnetic field measuring element 2 is rotated with respect to the rotation axis 23 and thereafter, it is further rotated with respect to the rotation axis 4. In FIG. 28, the magnetic field measuring element 2 before being rotated with respect to the rotation axis 23 is shown. In FIG. 29, the magnetic field measuring element when it is rotated by 180 degrees around the rotation axis 23 of the disk 22 is shown as a magnetic field measuring element 24. In FIG. 30, a magnetic field measuring element that is the magnetic field measuring element 24 after being rotated by 180 degrees around the rotation axis 4 is shown as a magnetic field measuring element 25.

Based on the placements of the magnetic field measuring element in FIG. 28 to FIG. 30, a coil displacement correction method including the magnetic field measuring method according to Embodiment 2 will be described. In FIG. 31, magnetic fields are shown that are received by the magnetic field measuring surface (Hall element surface) of the magnetic field measuring element 2 in a state before rotation around the rotation axis 23 of the disk 22 and around the rotation axis 4 of the magnetic field measuring element 2. This FIG. 31 shows the same state as in FIG. 9. In FIG. 31, other than the numeral of the magnetic field measuring element, there is a difference only that the rotation axis 23 placed at the position that coincides with the coil axis of the measuring target coil is shown instead of the coil axis 3 in FIG. 9. FIG. 32 shows magnetic fields received by the magnetic field measuring surface (Hall element surface) of the magnetic field measuring element when the magnetic field measuring element 25 is moved up and down along the direction of the Z-axis in the state in FIG. 30.

In FIG. 32, a magnetic field vector 26 is a magnetic field vector of the coil received at the a-plane by the magnetic field measuring element 25 at the time the disk is rotated by 180 degrees. A magnetic field vector 28 is a magnetic field vector of the coil received at the b-plane by the magnetic field measuring element 25, and a magnetic field vector 30 is a magnetic field vector of the coil received at the c-plane by the magnetic field measuring element 25. A magnetic field component 27 is a magnetic field component in the surface-perpendicular direction received at the a-plane by the magnetic field measuring surface (Hall element surface) of the magnetic field measuring element 25, and a magnetic field component 29 is a magnetic field component in the surface-perpendicular direction received at the b-plane by the magnetic field measuring surface (Hall element surface) of the magnetic field measuring element 25.

The magnetic field components received by the magnetic field measuring surface (Hall element surface) of the magnetic field measuring element 25 in FIG. 32 become the same as in FIG. 10, provided that there is a difference in the direction of the inclination of the magnetic field measuring surface (Hall element surface). Namely, the magnetic field component 27 at the a-plane is the maximum magnetic field and the magnetic field component at the c-plane becomes zero. When a magnetic field distribution along the Z-axis of the radial magnetic fields Br received by the magnetic field measuring surface (Hall element surface) of the magnetic field measuring element 25 in FIG. 32, and a magnetic field distribution along the Z-axis of the radial magnetic fields Br received by the magnetic field measuring surface (Hall element surface) of the magnetic field measuring element 2 in FIG. 31, are drawn, the same distributions as in FIG. 11 are provided. Namely, the magnetic field distribution along the Z-axis of the radial magnetic fields Br received by the magnetic field measuring surface (Hall element surface) of the magnetic field measuring element 25 in FIG. 32 becomes the same as the magnetic field distribution 65 in FIG. 1l. The magnetic field distribution along the Z-axis of the radial magnetic fields Br received by the magnetic field measuring surface (Hall element surface) of the magnetic field measuring element 2 in FIG. 31 becomes the same as the magnetic field distribution 64 in FIG. 11.

As has been described in Embodiment 1, the inter-coil center position can be detected from the intersection point between the magnetic field distribution 64 in which the radial magnetic field Br before rotation varies in the Z-direction and the magnetic field distribution 65 in which the radial magnetic field Br after rotation by 180 degrees at the second offset position varies in the Z-direction.

It is noted that, when magnetic fields are measured in a rotated manner along the rotation axis 23 using the magnetic field measuring apparatus 1 in Embodiment 2 shown in FIG. 27, as long as no displacement occurs in the magnetic field measuring element 2 during rotation, the distribution at zero degree before rotation with respect to the rotation axis 4 and the distribution at 180 degrees after that rotation should ideally each be a COS distribution (distribution in the shape of a COS waveform). In contrast, if there is a deformation or the like in the coil, etc., these distributions are each thought to become another distribution in which a harmonic is overlapped, so that a deformation of the coil can be found. Namely, according to the magnetic field measuring apparatus 1 of Embodiment 2, with application of a Fourier transformation, it is possible to determine a deformation of the coil.

Figure 33:
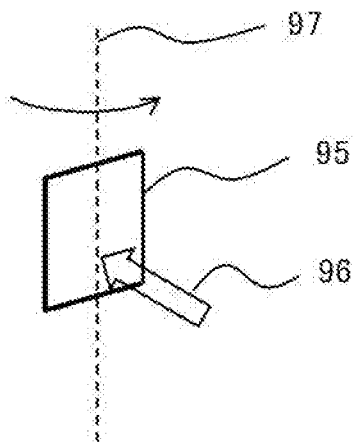
FIG. 33 is a diagram showing another magnetic field measuring element according to Embodiment 2 of the invention.
Figure 34:
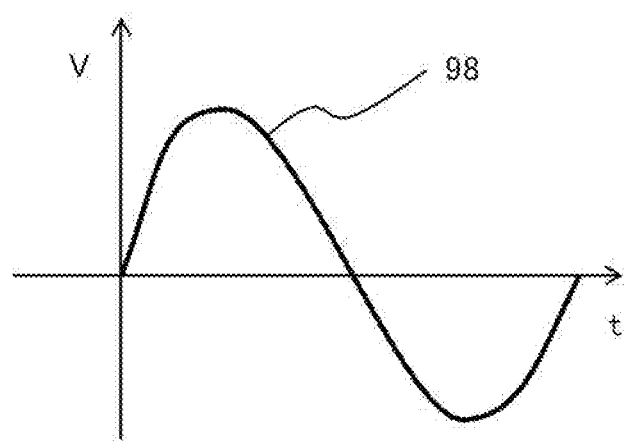
FIG. 34 is a diagram showing a waveform of a voltage outputted by the magnetic field measuring element of FIG. 33.

So far, the magnetic field measuring element 2 is assumed to be such an element that can, even though having directionality, detect a magnetic field without rotation or movement of the magnetic field measuring element 2. However, the magnetic field measuring element 2 may be such an element that generates no electromotive force if it does not rotate, for example, a search coil. In the following, description will be made about a search coil. FIG. 33 is a diagram showing another magnetic field measuring element according to Embodiment 2 of the invention, and FIG. 34 is a diagram showing a waveform of a voltage outputted by the magnetic field measuring element of FIG. 33. In FIG. 34, the ordinate represents the voltage V, and the abscissa represents time t. The detection principle of a search coil 95 will be described using FIG. 33 and FIG. 34. When the search coil 95 is rotated with respect to its rotation axis 97, a voltage responsive to a change in a magnetic flux 96 interlinked with the search coil 95 is outputted at both ends of the search coil 95 as shown by a voltage waveform 98 in FIG. 34. Furthermore, integrating the voltage makes it possible to measure a magnetic field perpendicular to a search-coil surface of the search coil 95.

In the following, it is assumed that the rotation axis 97 is directed in the vertical direction (Z-direction) as shown in FIG. 33. Since the search coil 95 is larger than the Hall element, it is easy to direct the rotation axis 97 in the vertical direction (Z-direction). When the rotation axis 97 of the search coil 95 is directed in the vertical direction (Z-direction), it is possible to measure the radial magnetic field Br perpendicular to the Z-direction. Meanwhile, if the search coil 95 or a supporting rod (not shown) that supports the search coil 95 is long in the direction of the Z-axis, a displacement of the rotation axis during rotation may be minimized.

When the search coil 95 is placed at a position apart from the reference axis (coil axis of the coil) and is then moved up and down in the Z-direction, the magnetic field vectors detected by the search coil 95 become the same as in FIG. 31. Furthermore, when the magnetic field vectors are measured after the disk 22 is rotated by 180 degrees, they become the same as in FIG. 32. Accordingly, the magnetic field distributions detected by the search coil 95 become like those shown in FIG. 13, so that the inter-coil center position can be determined from an intersection point between the magnetic field distributions before and after rotation with respect to the rotation axis 23.

According to the magnetic field measuring method of Embodiment 2, like the magnetic field measuring method of Embodiment 1, it is possible to highly accurately determine the inter-coil center position of the combination coil (split solenoid coil 7, banana-shaped coil 33) as the measuring target provided with the plurality of coils (first coil, second coil). Further, in the coil displacement correction method according to Embodiment 2, like the coil displacement correction method of Embodiment 1, it suffices to perform adjustment on the positions of the respective coils in the combination coil so that the inter-coil center plane 9 and a magnetic-field-measurement reference plane (the reference plane of the measuring target coil) coincide with each other; thus, the third-type coil displacement described previously can be adjusted highly accurately. When the combination coil is the split solenoid coil 7, adjustment is performed on the relative positions of the first coil 60 and the second coil 61 so that the inter-coil center plane 9 and the magnetic-field-measurement reference plane (the reference plane of the measuring target coil) coincide with each other.

Embodiment 3

Figure 35:
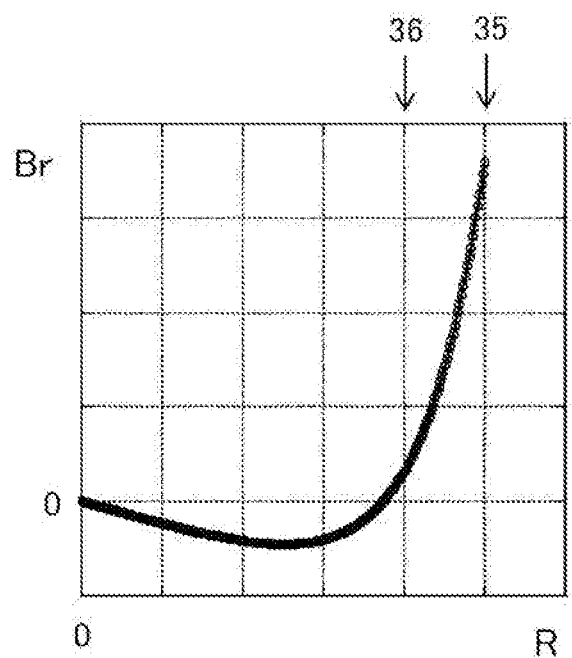
FIG. 35 is a diagram for illustrating a position of a magnetic field measuring element according to Embodiment 3 of the invention.

A magnetic field measuring method of Embodiment 3 will be described. FIG. 35 is a diagram for illustrating a position of a magnetic field measuring element according to Embodiment 3 of the invention. In FIG. 35, a radial-direction (R-direction) dependency of the radial magnetic fields Br of a split solenoid coil is shown. The ordinate represents the radial magnetic field Br, and the abscissa represents the position R in the radial direction. In FIG. 35, a coil inner-diameter position 35 and a coil inner-diameter position 36 are shown. The coil inner-diameter position 36 is a position corresponding to four-fifths of the coil internal-radius RO. As shown in FIG. 35, at R=0, the radial magnetic field Br is zero and thus, FIG. 35 shows examples in the cases where the position is slightly shifted along the R-direction from the coil axis. Such a magnetic field distribution is related to the shape of the split solenoid coil.

The larger the radial magnetic field Br, the better the sensitivity of the magnetic field measuring element 2 becomes. In the case of FIG. 35, the magnetic field increases abruptly when the position R in the radial direction (R-direction) goes beyond the position corresponding to four-fifths of the coil internal-radius RO (when it goes beyond the coil inner-diameter position 36). Namely, the radial magnetic field Br becomes larger as the position becomes closer to the coil inner-diameter position 35. This increase of the radial magnetic field Br according to the expansion of the R-direction position is due to the coil shape. It can be said that, if the position at which the magnetic field measuring element 2 is placed, that is, the offset position from the coil axis, is at least placed in a large-length region of four-fifths of RO or more, a radial magnetic field Br is obtained that is larger than that obtained in a region of less than four-fifths of RO.

In the magnetic field measuring method of Embodiment 3, the radial magnetic field Br is measured by the magnetic field measuring element 2 at a place corresponding to four-fifths or more of the coil internal-radius RO of the solenoid coil. A magnetic field measuring apparatus 1 of Embodiment 3 is that in which the magnetic field measuring element 2 is placed so that the placement position in the radial direction (R-direction) of the magnetic field measuring element 2, that is, the offset position apart by the offset length r0 from the coil axis 3, corresponds to four-fifths or more of the coil internal-radius RO. According to the magnetic field measuring method of Embodiment 3, a large radial magnetic field Br can be measured, so that it is possible to measure the radial magnetic field Br more sensitively and more accurately than by the measuring method in which the placement position in the radial direction (R-direction) of the magnetic field measuring element 2 corresponds to less than four-fifths of the coil internal-radius RO. Thus, according to the magnetic field measuring method of Embodiment 3, it is possible to more highly accurately determine the inter-coil center position of the coil pair (first coil, second coil) as the measuring target (split solenoid coil 7, banana-shaped coil 33), namely, the combination coil.

Embodiment 4

Figure 36:
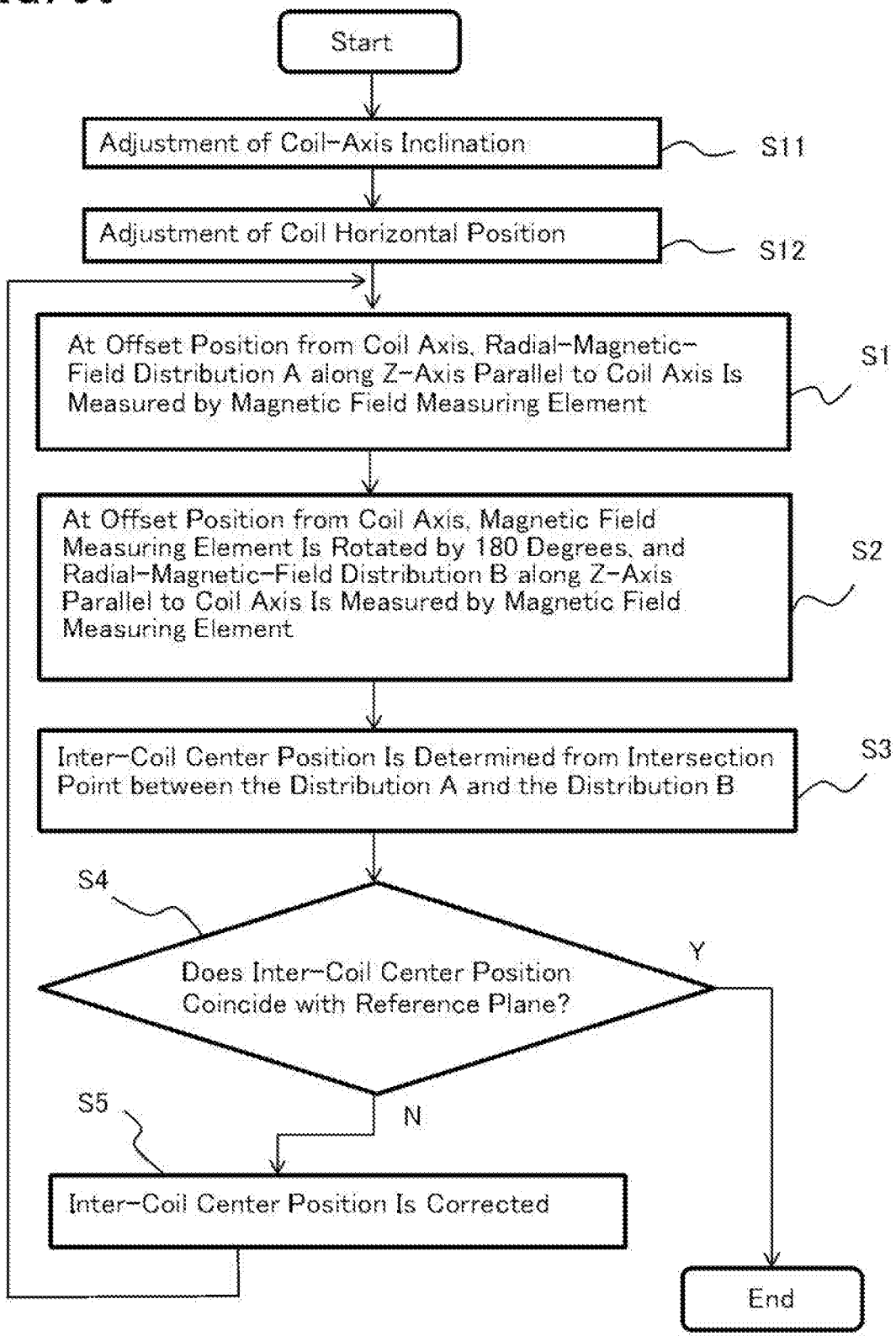
FIG. 36 is a flowchart of a coil displacement correction method according to Embodiment 4 of the invention.
Figure 37:
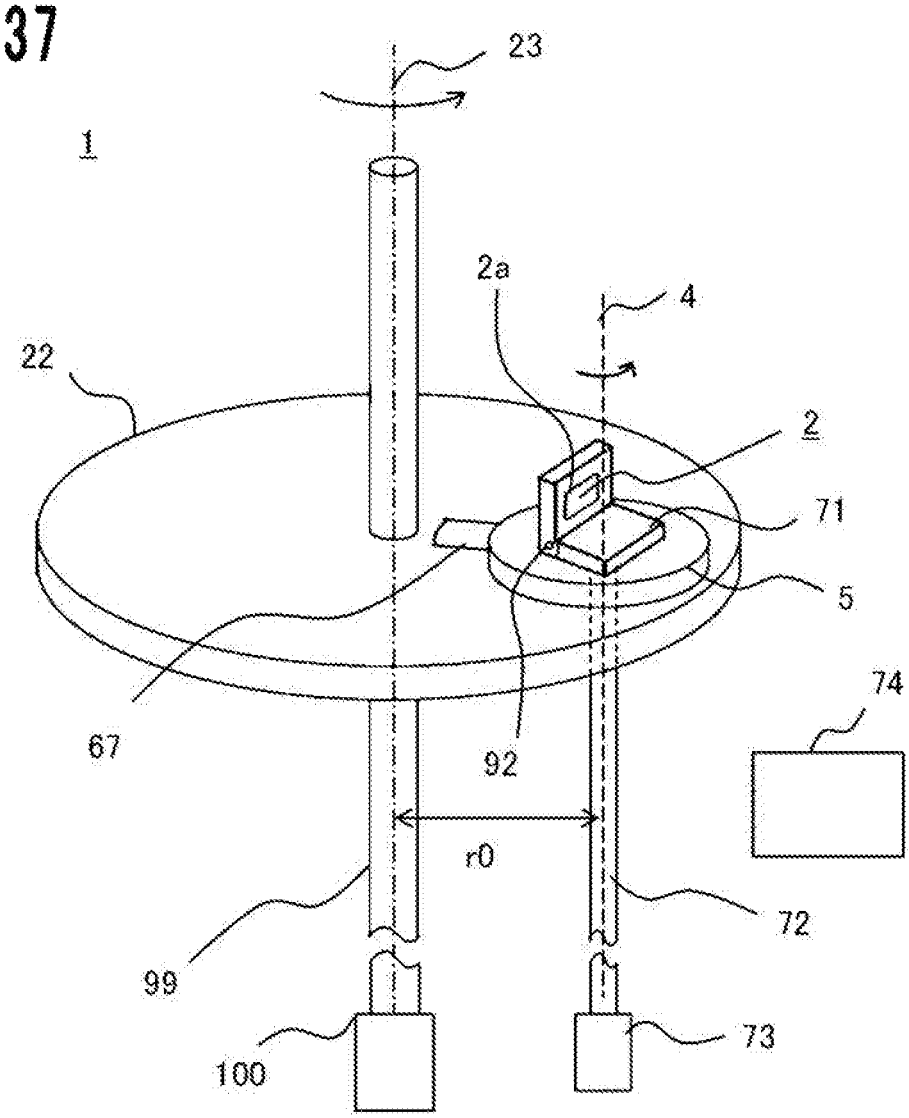
FIG. 37 is a diagram showing a magnetic field measuring apparatus according to Embodiment 4 of the invention.
Figure 38:
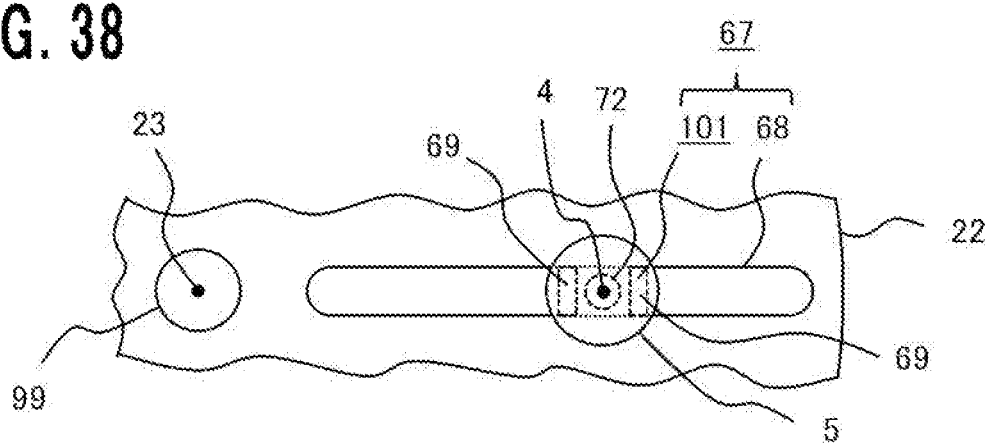
FIG. 38 is a diagram showing a moving mechanism in FIG. 37.
Figure 39:
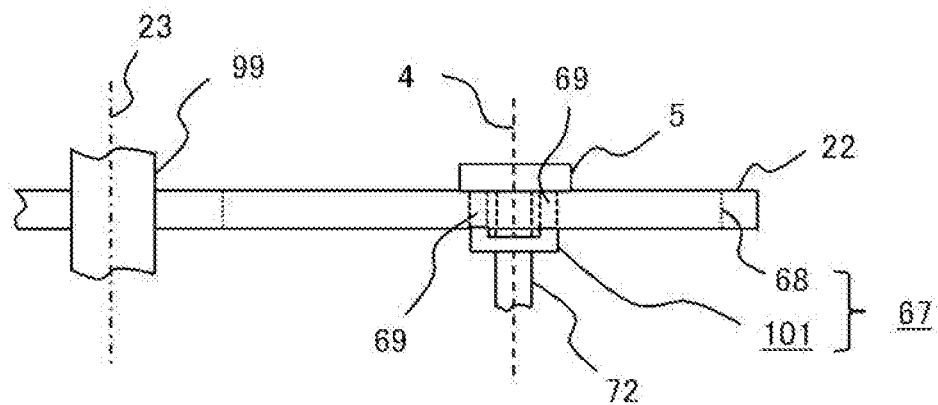
FIG. 39 is a side view of the moving mechanism of FIG. 38.
Figure 40:
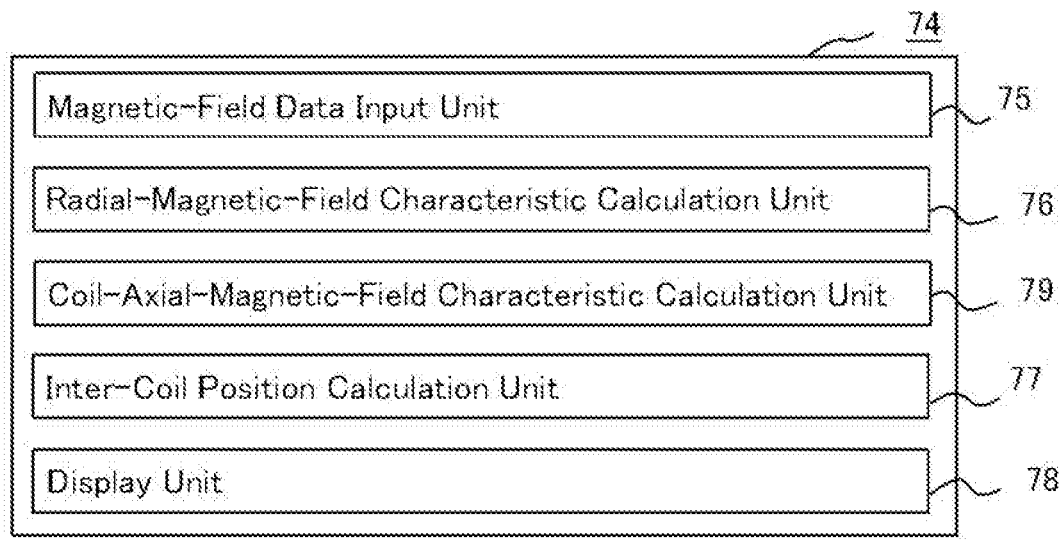
FIG. 40 is a diagram showing a data processing device in FIG. 37.

FIG. 36 is a flowchart of a coil displacement correction method according to Embodiment 4 of the invention. FIG. 37 is a diagram showing a magnetic field measuring apparatus according to Embodiment 4 of the invention, and FIG. 38 is a diagram showing a moving mechanism in FIG. 37. FIG. 39 is a side view of the moving mechanism of FIG. 38, and FIG. 40 is a diagram showing a data processing device in FIG. 37. The flowchart of FIG. 36 is resulted from adding, to the flowchart of FIG. 1, a coil-axis-inclination adjusting process (Step S11) and a coil-horizontal-displacement adjusting process, namely, coil-axis-position adjusting process (Step S12). The coil-axis-inclination adjusting process in Step S11 and the coil-horizontal-displacement adjusting process (coil-axis-position adjusting process) in Step S12 are a coil-axis adjusting process for adjusting respective coil axes of the plurality of coils (first coil, second coil) so as to coincide with a reference axis. The flowchart will be described citing the split solenoid coil 7 as an example.

As the coil-axis-inclination adjusting process in Step S11 and the coil-horizontal-displacement adjusting process in Step S12, the measuring and correcting processes in Patent Document 1 are applied. Execution of the coil-horizontal-displacement adjusting process in Step S11 and the coil-axis-inclination adjusting process in Step S12 makes it possible to highly accurately and surely perform the processes of correcting the inter-coil center position in Step S1 to Step S5. If adjustment on the coil horizontal displacement (first-type coil displacement) and the displacement in the coil-axis inclination (second-type displacement) was not performed before execution of the processes of correcting the inter-coil center position in Step S1 to Step S5, in the magnetic field distribution as shown in FIG. 9 or the like, a magnetic field inclination occurs due to the first-type coil displacement and the second-type coil displacement. Thus, the magnetic field according to that magnetic field inclination is applied to the magnetic field measuring element, so that an angular error occurs at the time of determining the inter-coil center position.

The coil-axis-inclination adjusting process in Step S11 and the coil-horizontal-displacement adjusting process in Step S12 are performed for each of the first coil 60 and the second coil 61 in the split solenoid coil 7. Description will be made citing the first coil 60 as an example. First, the coil-axis-inclination adjusting process in Step S11 is executed. The magnetic field measuring surface (Hall element surface) 2a of the magnetic field measuring element 2 is caused to face in the coil-axial direction (Z-axial direction), namely, the extending direction of the magnetic field measuring surface (Hall element surface) 2a is set to be perpendicular to the coil axis, and then the coil-axial magnetic fields Bz with respect to the radial positions (R-positions) of the magnetic field measuring element 2 are measured using, as a parameter, the rotation angle around the rotation axis 23 (first measuring step). The first measuring step is to be performed while correcting the inclination of the rotation axis 23 (coil-axis changing step). If respective characteristics that are each a characteristic of the coil-axial magnetic fields Bz with respect to the radial positions (R-positions) of the magnetic field measuring element 2 and are obtained when the rotation angle around the rotation axis 23 is varied, become parallel to each other, it is determined that the inclination of the rotation axis 23 coincides with the coil axis 3, so that the coil-axis-inclination adjusting process is terminated. In the coil-axis changing step, an attitude of the first coil 60 or the second coil 61 as an adjustment target is changed to thereby change the inclination of the coil axis 3 relative to the reference axis for the adjustment target.

The coil-horizontal-displacement adjusting process in Step S12 is executed after the coil-axis-inclination adjusting process in Step S11. The magnetic field measuring surface (Hall element surface) 2a of the magnetic field measuring element 2 is caused to face in the radial direction (R-direction), namely, the extending direction of the magnetic field measuring surface (Hall element surface) 2a is set to be parallel to the coil axis, and then the radial magnetic fields Br with respect to the radial positions (R-positions) of the magnetic field measuring element 2 are measured using, as a parameter, the rotation angle around the rotation axis 23 (second measuring step). The second measuring step is to be performed while correcting the coil horizontal position by moving the position of the rotation axis 23 in the radial direction (coil-axis-position changing step). If respective characteristics that are each a characteristic of the radial magnetic fields Br with respect to the radial positions (R-positions) of the magnetic field measuring element 2 and are obtained when the rotation angle around the rotation axis 23 is varied, become overlapped to be the same one, it is determined that the coil horizontal position of the rotation axis 23 coincides with that of the coil axis 3, so that the coil-horizontal-displacement adjusting process is terminated. In the coil-axis-position changing step, the adjustment target is moved in the radial direction to thereby change the radial position of the coil axis 3 relative to the reference axis for the adjustment target. In the second measuring step to be applied after the coil-axis-position changing step, the radial magnetic field is measured at each of the radial positions of the magnetic field measuring element, using, as a parameter, the rotation angle subjected to the rotation around the rotation axis 23 in the second measuring step having been performed firstly (third measuring step). The third measuring step is the second measuring step to be applied after the coil-axis-position changing step.

In FIG. 37, a magnetic field measuring apparatus 1 is shown that can execute the coil-axis-inclination adjusting process in Step S11 and the coil-horizontal-displacement adjusting process in Step S12. In the magnetic field measuring apparatus 1 of Embodiment 4, the magnetic-field-measuring-element supporting table 71 is rotatable by means of the rotatable rod 92 so that the magnetic field measuring surface (Hall element surface) 2a of the magnetic field measuring element 2 can face in the coil-axial direction (Z-axial direction). Further, the magnetic field measuring apparatus 1 of Embodiment 4 includes a moving mechanism 67 for changing the radial position (R-position) of the magnetic field measuring element 2. Further, as shown in FIG. 40, the data processing device 74 of the magnetic field measuring apparatus 1 of Embodiment 4 also includes a coil-axial-magnetic-field characteristic calculation unit 79. By the coil-axial-magnetic-field characteristic calculation unit 79, the coil-axial magnetic fields Bz in the first measuring step are calculated based on the magnetic field data transmitted from the magnetic field measuring element 2, and the distribution of the coil-axial magnetic fields Bz is displayed on the screen of the display unit 78. The coil-axial-magnetic-field characteristic calculation unit 79 is implemented in such a manner that the processor 80 executes a program stored in the memory 81. Instead, plural processors 80 and plural memories 81 may execute the above function in their cooperative manner.

For example, the moving mechanism 67 is configured with a guide opening 68 formed in the disk 22 in a radially extending manner and a supporting member 101 slidably mounted to the rotatable rod 72. The supporting member 101 is provided with two protrusions 69 and the protrusions 69 are in contact with the guide opening 68. In the magnetic field measuring apparatus 1 of Embodiment 4, the rotatable rod 72 attached to the supporting member 101 is allowed to move along the guide opening 68 and, at plural radial positions, the rotary table 5 is allowed to rotate according to the rotation of the rotatable rod 72. Namely, the magnetic field measuring apparatus 1 of Embodiment 4 can perform: the coil-axis-inclination adjusting process in Step S1; the coil-horizontal-displacement adjusting process in Step S12; and the 180-degree rotation of the magnetic field measuring element 2 in Step S2. The magnetic field measuring apparatus 1 of Embodiment 4, since the other configuration is the same as in the configuration of the magnetic field measuring apparatus 1 of Embodiment 2, operates similarly to the magnetic field measuring apparatus 1 of Embodiment 2.

In the coil displacement correction method according to Embodiment 4, the coil-horizontal-displacement adjusting process in Step S11 and the coil-axis-inclination adjusting process in Step S12 are executed, so that it is possible to highly accurately and surely perform the processes of correcting the inter-coil center position in Step S1 to Step S5.

Embodiment 5

Figure 41:
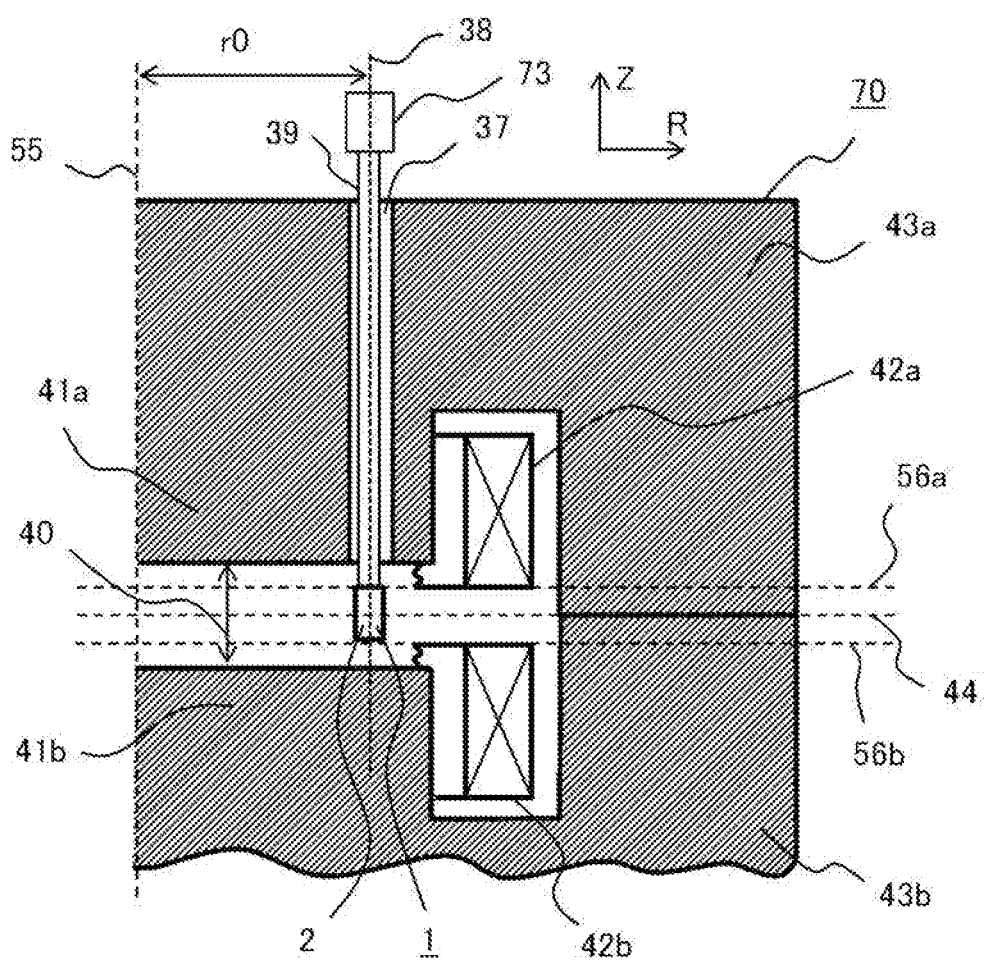
FIG. 41 is a diagram showing an example in which a magnetic field measuring element of a first magnetic field measuring apparatus according to Embodiment 5 of the invention is placed in an accelerator electromagnet.
Figure 42:
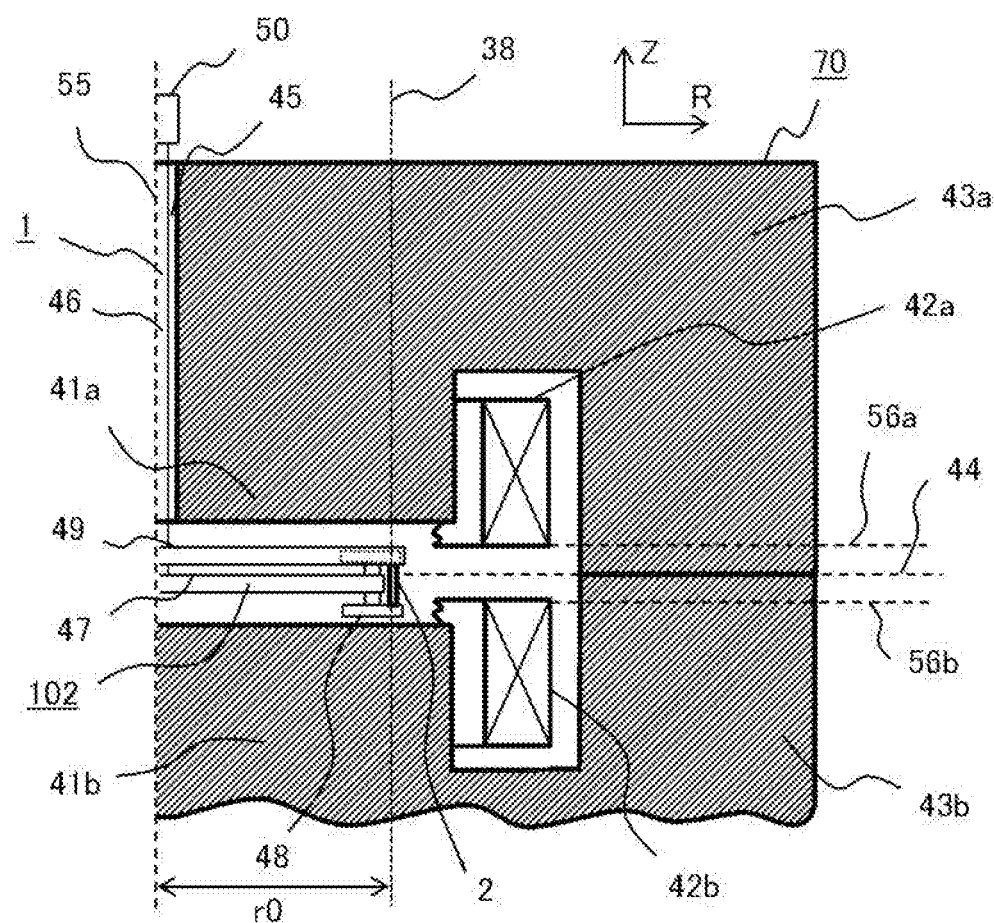
FIG. 42 is a diagram showing an example in which a magnetic field measuring element of a second magnetic field measuring apparatus according to Embodiment 5 of the invention is placed in an accelerator electromagnet.
Figure 43:
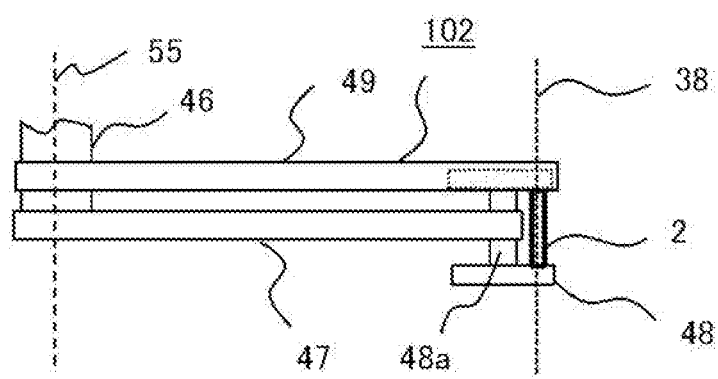
FIG. 43 is a diagram showing a main part of the magnetic field measuring apparatus in FIG. 42.
Figure 44:
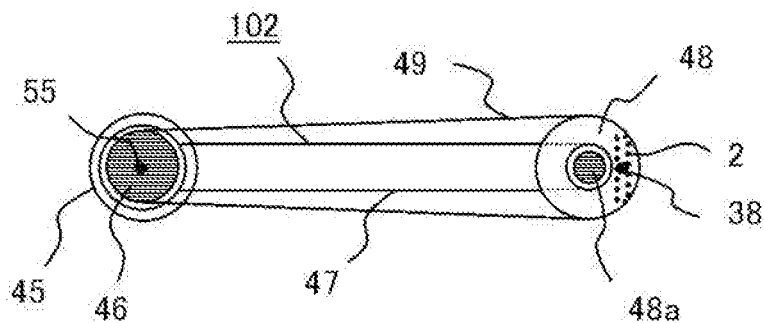
FIG. 44 is a top view of a main part of the magnetic field measuring apparatus in FIG. 43, viewed from a coil-axial direction.
Figure 45:
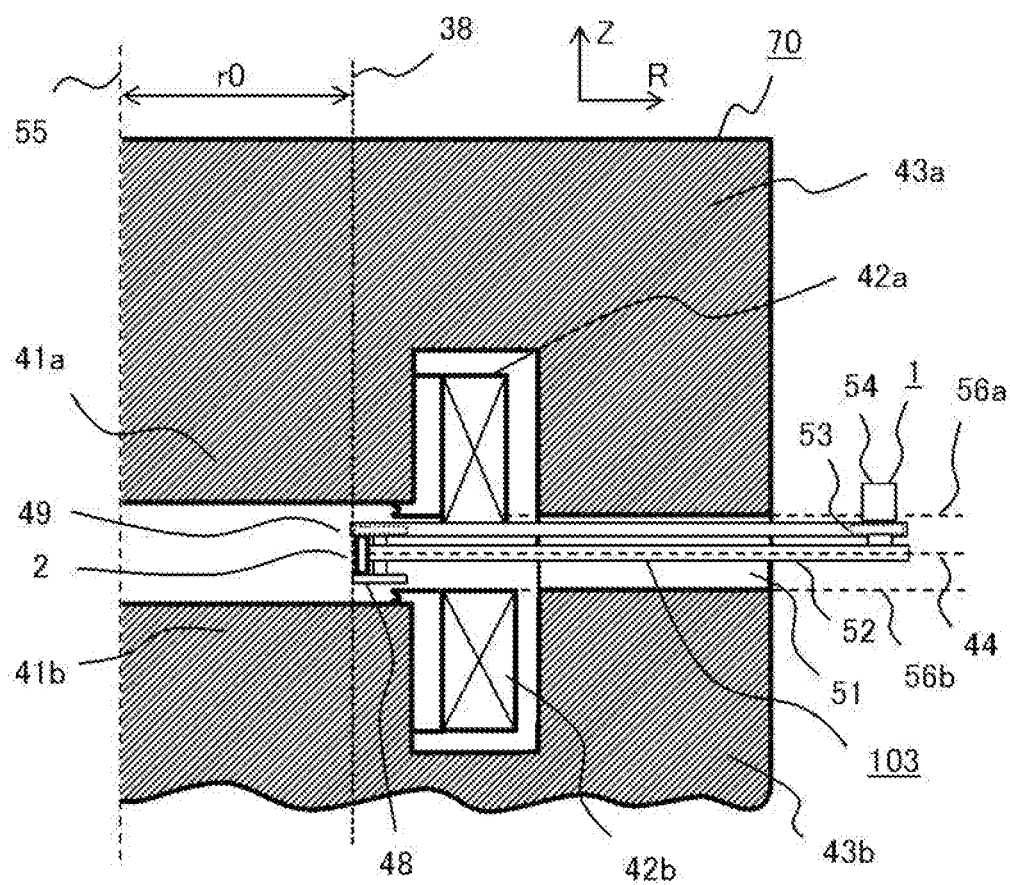
FIG. 45 is a diagram showing an example in which a magnetic field measuring element of a third magnetic field measuring apparatus according to Embodiment 5 of the invention is placed in an accelerator electromagnet.
Figure 46:
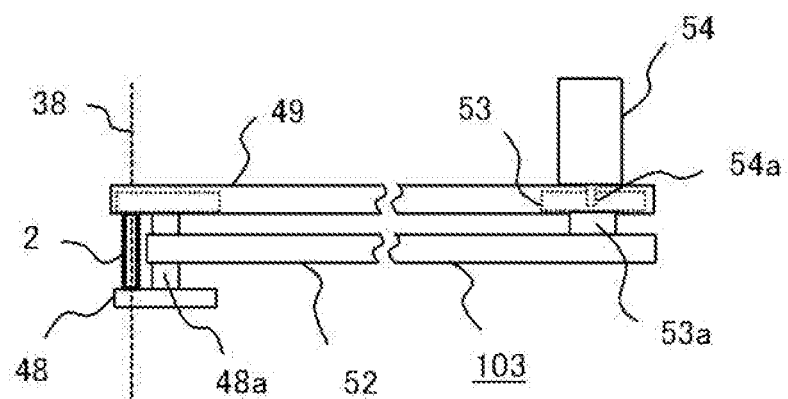
FIG. 46 is a diagram showing a main part of the magnetic field measuring apparatus in FIG. 45.
Figure 47:
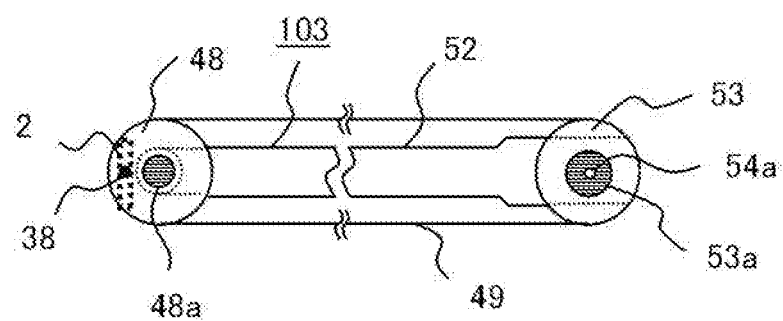
FIG. 47 is a top view of a main part of the magnetic field measuring apparatus in FIG. 46, viewed from a coil-axial direction.

In Embodiment 5, description will be made on examples in which magnetic-field measurement is performed using, as its target, an accelerator electromagnet. Coil-position correction is performed using the measurement result thereof. FIG. 41 is a diagram showing an example in which a magnetic field measuring element of a first magnetic field measuring apparatus according to Embodiment 5 of the invention is placed in an accelerator electromagnet. FIG. 42 is a diagram showing an example in which a magnetic field measuring element of a second magnetic field measuring apparatus according to Embodiment 5 of the invention is placed in an accelerator electromagnet. FIG. 43 is a diagram showing a main part of the magnetic field measuring apparatus in FIG. 42, and FIG. 44 is a top view of a main part of the magnetic field measuring apparatus in FIG. 43, viewed from a coil-axial direction. FIG. 45 is a diagram showing an example in which a magnetic field measuring element of a third magnetic field measuring apparatus according to Embodiment 5 of the invention is placed in an accelerator electromagnet. FIG. 46 is a diagram showing a main part of the magnetic field measuring apparatus in FIG. 45, and FIG. 47 is a top view of a main part of the magnetic field measuring apparatus in FIG. 46, viewed from a coil-axial direction. In each of FIG. 41, FIG. 42 and FIG. 45, a partial cross-section of a circular-accelerator electromagnet 70 in which coils are placed at its magnetic poles, is shown.

The circular-accelerator electromagnet 70 is divided into two electromagnets. The first electromagnet includes a coil 42a, a magnetic pole 41a and a return yoke 43a. Like the first electromagnet, the second electromagnet includes a coil 42b, a magnetic pole 41b and a return yoke 43b. In the magnetic pole 41a of the first electromagnet, a penetrating hole 37 is formed. A magnetic field measuring element 2 of the magnetic field measuring apparatus 1 is placed in an inter-pole region 40 that is a region between the magnetic pole 41a and the magnetic pole 41b. The magnetic field measuring element 2 is connected to a rotatable rod 39 and the rotatable rod 39 is connected to the motor 73. In FIG. 41, FIG. 42 and FIG. 45, a coil axis 55 of the coils 42a, 42b, a rotation axis 38 of the magnetic field measuring element 2, an orbital plane 44 in which a beam to be accelerated by the circular accelerator electromagnet 70 passes, a first-coil plane 56a of the coil 42a and a second-coil plane 56b of the coil 42b, are shown. The rotation axis 38 of the magnetic field measuring element 2 is the same as the rotation axis 4 in Embodiments 1 to 4; however, its penetrates through the magnetic pole 41a. The rotation axis 38 is placed at a position radially apart from the coil axis 55, and its distance to the coil axis 55 is the offset length r0.

The magnetic poles 41a, 41b can be fabricated highly accurately by an NC apparatus (numerical control apparatus) or the like. Thus, in the magnetic field measuring apparatus 1, the reference axis and the reference plane are set with reference to the magnetic poles 41a, 41b in many cases. The rotatable rod 39 is inserted from the outside of the magnetic pole 41a, namely, the outside of the circular accelerator electromagnet 70. In this case, the rotatable rod 39 can be set up highly accurately because it is long and thus the inclination and the like, of the rotation axis 38 are very small. Further, it is easily possible to rotate the magnetic field measuring element 2 from the outside of the circular accelerator electromagnet 70 by rotating the rotatable rod 39 using the motor 73 from the outside of the circular accelerator electromagnet 70. Furthermore, it is possible to also measure the magnetic field distribution in the coil-axial direction (Z-axial direction) by moving the rotatable rod 39 in the Z-axial direction (up and down in FIG. 41) to thereby move the magnetic field measuring element 2 in the Z-axial direction. In the circular accelerator electromagnet 70, the orbital plane 44 is the reference plane to which the inter-coil center position is to be matched.

Since the magnetic field measuring element 2 is rotatably placed at a position apart from the coil axis 55, the first magnetic field measuring apparatus 1 of Embodiment 5 can execute the magnetic field measuring method of Embodiment 1 and thus can determine highly accurately the inter-coil center position of the coil pair (coil 42a, coil 42b) as the measuring target in the circular accelerator electromagnet 70. Further, since the inter-coil center position of the coil pair (coil 42a, coil 42b) in the circular accelerator electromagnet 70 can be determined highly accurately, it is possible to correct the inter-coil center position so as to coincide with the reference plane (orbital plane 44), by moving a structural object of the measuring target.

It is noted that the magnetic poles 41a, 41b and the return yokes 43a, 43b in the circular accelerator electromagnet 70 are heavy in weight and difficult to be disassembled. Thus, it is desired that, once the components of the magnetic field measuring apparatus 1 are additionally placed in the circular accelerator electromagnet 70, the return yokes 43a, 43b and the like be not disassembled until completion of the magnetic-field measurement. Thus, it is important to cause the magnetic field measuring element 2 to operate, from the outside of the circular accelerator electromagnet 70.

It is noted that, even in the case of an air-core coil without having the magnetic poles 41a, 41b, if its length in the coil-axial direction is set sufficiently long, it is also possible to minimize the error at the time of rotation. Meanwhile, when the penetrating hole 37 is created in the magnetic pole 41a, no magnetic field is generated in the portion of the penetrating hole 37 and this may result in a magnetic-field error. In this case, it is preferable to backfill the penetrating hole 37 after completion of the magnetic-field measurement and the coil displacement by use of the first magnetic field measuring apparatus 1. Namely, after determination in Step S4 in FIG. 1 that the inter-coil center position coincides with the reference plane, a step of backfilling the penetrating hole 37 formed in the magnetic pole 41a after the magnetic-field measurement (penetrating-hole backfilling step) is added. In this manner, backfilling the penetrating hole 37 formed in the magnetic pole 41a after the magnetic-field measurement makes it possible to minimize the magnetic-field error due to the penetrating hole 37 in the circular accelerator electromagnet 70.

Using FIG. 42 to FIG. 44, a second magnetic field measuring apparatus 1 of Embodiment 5 will be described. There are cases where, in the circular accelerator electromagnet 70, an ion-source hole 45 for an ion source is created at the electromagnet center axis. Let's assume to cause the magnetic field measuring element 2 to operate, utilizing the ion-source hole 45. Since the ion-source hole 45 is created originally, it is unnecessary to create the penetrating hole 37 in the magnetic pole 41a as shown in FIG. 41 and this makes it possible to eliminate an error in the magnetic field distribution due to creation of the penetrating hole 37.

The second magnetic field measuring apparatus 1 of Embodiment 5 includes a rotatable rod 46, a motor 50 for rotating a rotatable rod by which the rotatable rod 46 is rotated, and an element supporting mechanism 102 for supporting rotatably the magnetic field measuring element 2. The element supporting mechanism 102 includes: a supporting member 47 for supporting the magnetic field measuring element 2 with respect to the rotatable rod 46; a table 48 on which the magnetic field measuring element 2 is mounted; and a belt 49 that connects the rotatable rod 46 with the table 48 on which the magnetic field measuring element 2 is placed. The table 48 is provided also as a pulley, and the belt 49 is in contact with the outer circumference of the table 48. In the supporting member 47, its one end is slidably connected to the rotatable rod 46, and the other end supports rotatably a table rod 48a of the table 48. Note that the supporting member 47 is engaged with the magnetic pole 41a so as not to rotate with respect to the coil axis 55 due to rotation of the rotatable rod 46. However, the supporting member 47 has a vertically movable mechanism. For example, it suffices that the supporting member 47 has, on its side toward the ion-source hole 45, an engaging portion to be engaged with a concave portion formed in the inner wall of the ion-source hole 45. The thus-configured supporting member 47 can keep its placement position relative to the magnetic pole 41a, without rotating with respect to the coil axis 55 due to rotation of the rotatable rod 46.

When the rotatable rod 46 is inserted in the ion-source hole 45 and then the rotatable rod 46 and the table 48 on which the magnetic field measuring element 2 is placed are connected together using the belt 49, it is possible to rotate the magnetic field measuring element 2 from the outside by rotating the rotatable rod 46 using the motor 50.

Since the magnetic field measuring element 2 is rotatably placed at a position apart from the coil axis 55, the second magnetic field measuring apparatus 1 of Embodiment 5 can execute the magnetic field measuring method of Embodiment 1 and thus can determine highly accurately the inter-coil center position of the coil pair (coil 42a, coil 42b) as the measuring target in the circular accelerator electromagnet 70. Further, since the inter-coil center position of the coil pair (coil 42a, coil 42b) in the circular accelerator electromagnet 70 can be determined highly accurately, it is possible to correct the inter-coil center position so as to coincide with the reference plane (orbital plane 44), by moving a structural object of the measuring target.

Using FIG. 45 to FIG. 47, a third magnetic field measuring apparatus 1 of Embodiment 5 will be described. The third magnetic field measuring apparatus 1 of Embodiment 5 is an apparatus that is applied to a circular accelerator electromagnet 70 in which a penetrating hole 51 is created at the lateral side of the return yokes 43a, 43b.

The third magnetic field measuring apparatus 1 of Embodiment 5 includes an element supporting mechanism 103 for supporting rotatably the magnetic field measuring element 2, and a motor 54 for rotating the magnetic field measuring element 2. The element supporting mechanism 103 includes: a table 48 on which the magnetic field measuring element 2 is mounted; a pulley 53 connected to a motor 54; a supporting member 52 that connects a pulley rod 53a of the pulley 53 with the table rod 48a of the table 48, and supports the magnetic field measuring element 2; and a belt 49 that connects the pulley 53 with the table 48 on which the magnetic field measuring element 2 is placed. The table 48 is provided also as a pulley, and the belt 49 is in contact with the outer circumference of the table 48. The supporting member 52 is fixed to an unshown fixed base on the outside of the circular accelerator electromagnet 70. In the supporting member 52, its one end is connected to the pulley rod 53a in a rotatable manner, and the other end is connected to the table rod 48a of the table 48 in a rotatable manner. According to the third magnetic field measuring apparatus 1 of Embodiment 5, it is possible to also measure the magnetic field distribution in the coil-axial direction (Z-axial direction) by moving the supporting member 52 in the Z-direction (up and down in FIG. 45) to thereby move the magnetic field measuring element 2 in the Z-axial direction.

When the third magnetic field measuring apparatus 1 of Embodiment 5 is used, it is possible to measure the magnetic field distribution inside the circular accelerator electromagnet 70, by creating the penetrating hole 51 in the return yokes 43a, 43b in the circular accelerator electromagnet 70 without creating the penetrating hole 37 in the magnetic poles 41a, 41b. Like the second magnetic field measuring apparatus 1 of Embodiment 5 that utilizes the ion-source hole 45, the third magnetic field measuring apparatus 1 of Embodiment 5 can minimize the impact on the magnetic field distribution.

According to the third magnetic field measuring apparatus 1 of Embodiment 5, since the element supporting mechanism 103 by which the magnetic field measuring element 2 is rotatably supported is inserted through the penetrating hole 51 formed at the lateral side of the return yokes 43a, 43b, it is possible from the outside of the circular accelerator electromagnet 70, to rotate the magnetic field measuring element 2 around the rotation axis 38 and to move the element supporting mechanism 103 in the Z-direction (up and down in FIG. 45).

Since the magnetic field measuring element 2 is rotatably placed at a position apart from the coil axis 55, the third magnetic field measuring apparatus 1 of Embodiment 5 can execute the magnetic field measuring method of Embodiment 1 and thus can determine highly accurately the inter-coil center position of the coil pair (coil 42a, coil. 42b) as the measuring target in the circular accelerator electromagnet 70. Further, since the inter-coil center position of the coil pair (coil 42a, coil 42b) in the circular accelerator electromagnet 70 can be determined highly accurately, it is possible to correct the inter-coil center position so as to coincide with the reference plane (orbital plane 44), by moving a structural object of the measuring target.

A coil position correction method of Embodiment 5 is a coil position correction method of correcting a coil displacement in an electromagnet (circular accelerator electromagnet 70) by using the magnetic field measuring apparatus 1 of Embodiment 5 (first magnetic field measuring apparatus 1, second magnetic field measuring apparatus 1, third magnetic field measuring apparatus 1), said coil position correction method characterized by comprising: executing an inter-coil-center-position adjusting process of changing one or plural ones among the positions of the magnetic poles 41a, 41b, the coils 42a, 42b and the return yokes 43a, 43b in the electromagnet (circular accelerator electromagnet 70) on the basis of the inter-coil center position determined in the center-position determining step, to thereby adjust the inter-coil center position so as to be placed on the reference plane (orbital plane 44); and, after the inter-coil-center-position adjusting process, backfilling the penetrating hole 37 formed in the magnetic pole 41a, 41b after drawing out the magnetic field measuring element 2 and a rotation mechanism (rotatable rod 39, element supporting mechanism 102, element supporting mechanism 103) through the penetrating hole 37. According to the coil position correction method of Embodiment 5, due to these characteristics, it is possible to correct the inter-coil center position so as to coincide with the reference plane (orbital plane 44), by moving a structural object of the measuring target, and to minimize the magnetic-field error due to the penetrating hole 37 in the circular accelerator electromagnet 70, by backfilling the penetrating hole 37 after the magnetic-field measurement.

Lastly, an impact of an iron magnetic pole on the measurement of magnetic field distribution will be described. When the coils 42a, 42b are superconductive coils, the circular accelerator electromagnet 70 generally induces a 5T to 6T magnetic field. In this magnetic field, the 2T magnetic field is induced by the iron magnetic poles 41a, 41b and the remaining 3T to 4T magnetic field is induced in the superconductive coils. Iron is saturated under such a high magnetic field, and the magnetic poles 41a, 41b could be fabricated highly accurately, so that up-down symmetric magnetic fields will be induced in the direction of the coil axis 55. Thus, the center of the poles is set as the reference plane. When the magnetic poles 41a, 41b are saturated, the magnetic fields of the coils 42a, 42b are, though not to full extent (100%), applied directly around the orbital plane 44 in which the beam passes. Accordingly, if the inter-coil center position is displaced up or down on the Z-axis from the reference plane, in the magnetic fields induced by the coils 42a, 42b, up-down asymmetric components will emerge around the orbital plane 44. However, if the magnetic field measuring method of the invention is applied, the inter-coil center position of the coil pair (coil 42a, coil 42b) in the circular accelerator electromagnet 70 can be determined highly accurately, so that it is possible to correct the inter-coil center position so as to coincide with the reference plane (orbital plane 44), by moving a structural object of the measuring target.

It is noted that, in Embodiment 5, such examples have been shown in which the circular accelerator electromagnet 70 includes two coils 42a, 42b; however, the circular accelerator electromagnet 70 may include a combination coil provided with a plurality of coils having a common coil axis. Namely, if the circular accelerator electromagnet 70 includes a combination coil which is provided with a plurality of coils having a common coil axis and whose distribution along the coil axis of the radial magnetic fields is symmetric about a plane perpendicular to the coil axis, an effect similar to that in the case where the circular accelerator electromagnet 70 includes two coils 42a, 42b, is accomplished.

It should be noted that unlimited combination of the respective embodiments, and any appropriate modification and omission in the embodiments may be made in the present invention to the extent without creating contradiction.

DESCRIPTION OF REFERENCE NUMERALS AND SIGNS

1: magnetic field measuring apparatus, 2: magnetic field measuring element, 2a: magnetic field measuring surface, 3: coil axis, 4: rotation axis (offset axis), 5: rotary table, 7: split solenoid coil, 15: magnetic field measuring element, 16: magnetic field measuring element, 24: magnetic field measuring element, 25: magnetic field measuring element, 33: banana-shaped coil, 37: penetrating hole, 39: rotatable rod (rotation mechanism), 41a: magnetic pole, 41b: magnetic pole, 42a: coil, 42b: coil, 43a: return yoke, 43b: return yoke, 44: orbital plane (reference plane), 51: penetrating hole, 55: coil axis, 60: first coil, 61: second coil, 64: magnetic field distribution (first radial-magnetic-field characteristic), 65: magnetic field distribution (second radial-magnetic-field characteristic), 70: circular accelerator electromagnet, 74: data processing device, 87a: magnetic field distribution (first radial-magnetic-field characteristic), 87b: magnetic field distribution (second radial-magnetic-field characteristic), 88a: magnetic field distribution (first radial-magnetic-field characteristic), 88b: magnetic field distribution (second radial-magnetic-field characteristic), 89a: magnetic field distribution (first radial-magnetic-field characteristic), 89b: magnetic field distribution (second radial-magnetic-field characteristic), 90a: intersection point, 90b: intersection point, 90c: intersection point, 91a: magnetic field distribution (radial-magnetic-field angular characteristic), 91b: magnetic field distribution (radial-magnetic-field angular characteristic), 91c: magnetic field distribution (radial-magnetic-field angular characteristic), 93: first coil, 94: second coil, 102: element supporting mechanism (rotation mechanism), 103: element supporting mechanism (rotation mechanism), r0: offset length (set length).

The invention claimed is:

1. A magnetic field measuring method in which a combination coil provided with a plurality of coils having a common coil axis is used as a measuring target coil, and in which an inter-coil center position where a radial-magnetic-field distribution along the coil axis of the measuring target coil is up-down symmetric about a plane perpendicular to the coil axis, is determined, said magnetic field measuring method comprising, while using, as an offset axis, a direction that is parallel to the coil axis and at an offset position radially apart by a set length from the coil axis:

measuring a first radial-magnetic-field using a magnetic field sensor placed at the offset position, to thereby measure an intensity of a radial magnetic field, at the offset position;

measuring a second radial-magnetic-field using the magnetic field sensor after being rotated at the offset position by a set angle around the offset axis, to thereby measure an intensity of a radial magnetic field at the offset position, and measuring a center-position by:

measuring a first radial-magnetic-field distribution that is a distribution, along the offset axis, of intensities of radial magnetic fields of the coil that are measured such that the magnetic field sensor is moved along the direction of the offset axis in the first radial-magnetic-field measuring, measuring a second radial-magnetic-field distribution that is a distribution along the offset axis, of the intensities of radial magnetic fields of the coil that are measured such that the magnetic field sensor is moved along the direction of the offset axis in the second radial-magnetic-field measuring, and determining the inter-coil center position on the basis of the measured first radial-magnetic-field distribution and the measured second radial-magnetic-field distribution.

2. The magnetic field measuring method of claim 1, wherein, in the measuring the center-position, the inter-coil center position is determined from an intersection point between the second radial-magnetic-field distribution when the set angle is 180 degrees and the first radial-magnetic-field distribution.

3. The magnetic field measuring method of claim 1, wherein, in measuring the second radial-magnetic-field, second radial-magnetic-field intensities that are plural sets of intensities of the radial magnetic fields are measured at plural set angles each being the set angle, and wherein, in determining the center-position, a radial-magnetic-field angular characteristic that is a characteristic of the intensity of the radial magnetic field measured in the first radial-magnetic-field measuring and the second radial-magnetic-field intensities, with respect to the set angles is calculated at ever Z-position on the same offset axis, and then the Z-position at which a cosine component or a sine component in the radial-magnetic-field angular characteristic becomes zero is determined as the inter-coil center position.

4. The magnetic field measuring method of claim 1, wherein the plurality of coils in the measuring target coil is a split solenoid coil or a banana-shaped coil which is the combination coil that is symmetric in a direction of the coil axis, and the set length from the coil axis to the offset position at which the magnetic field sensor is placed is four-fifths or more of an internal radius of the split solenoid coil or the banana-shaped coil.

5. The magnetic field measuring method of claim 1, wherein, when the measuring target coil is a combination coil provided with a plurality of coils having a common coil axis, the measuring target coil comprises the plurality of coils in an electromagnet having magnetic poles, coils and return yokes;
 wherein the magnetic field sensor is mounted on a rotation mechanism for rotating the sensor around the offset axis; and
 wherein the magnetic field sensor and a part of the rotation mechanism are inserted between adjacent two coils in the plurality of coils through a penetrating hole formed in the magnetic pole or the return yoke.

6. The magnetic field measuring method of claim 1, further comprising:
 correcting an inclination of the coil axis relative to a reference axis of an instrument in which the combination coil is incorporated; and
 correcting a horizontal displacement of the coil axis relative to the reference axis.

7. A magnetic field measuring apparatus with which a combination coil provided with a plurality of coils having a common coil axis is used as a measuring target coil, and by which an inter-coil center position where a radial-magnetic-field distribution along the coil axis of the measuring target coil is up-down symmetric about a plane perpendicular to the coil axis, is determined while using, as an offset axis, a direction that is parallel to the coil axis and at an offset position radially apart by a set length from the coil axis, the magnetic field measuring apparatus comprising:
 a magnetic field sensor by which intensities of radial magnetic fields at the offset position are measured;
 a rotary table on which the magnetic field sensor is mounted at the offset position radially apart by the set length from the coil axis; and
 data processing circuitry configured to calculate the inter-coil center position on the basis of the intensities of the radial magnetic fields measured by the magnetic field sensor;
 wherein the data processing circuitry is further configured to
 receive the intensities of the radial magnetic fields measured by the magnetic field sensor;
 calculate a first radial-magnetic-field distribution along the offset axis, on the basis of the intensities of the radial magnetic fields at the offset position, that are inputted from the magnetic field sensor placed at the offset position;
 calculate a second radial-magnetic-field distribution along the offset axis, on the basis of intensities of the radial magnetic fields at the offset position, that are inputted from the magnetic field sensor after being rotated at the offset position by a set angle around the offset axis by the rotary table; and
 determine the inter-coil center position on the basis of the calculated first radial-magnetic-field distribution and the calculated second radial-magnetic-field distribution.

8. The magnetic field measuring apparatus of claim 7, wherein a horizontal position of the coil axis and an inclination of the coil axis, respectively, coincide with a horizontal position and an inclination of a reference axis of an instrument in which the coil is incorporated.

* * * * *